(12) United States Patent
Takeda et al.

(10) Patent No.: US 12,682,942 B2
(45) Date of Patent: Jul. 14, 2026

(54) MEMORY SYSTEM APPLYING READ VOLTAGE FOR READING DATA WITH SMALL NUMBER OF FAIL BITS

(71) Applicant: Kioxia Corporation, Tokyo (JP)

(72) Inventors: Naomi Takeda, Yokohama Kanagawa (JP); Masanobu Shirakawa, Chigasaki Kanagawa (JP)

(73) Assignee: Kioxia Corporation, Tokyo (JP)

( * ) Notice: Subject to any disclaimer, the term of this patent is extended or adjusted under 35 U.S.C. 154(b) by 205 days.

(21) Appl. No.: 18/438,635

(22) Filed: Feb. 12, 2024

(65) Prior Publication Data

US 2024/0274185 A1      Aug. 15, 2024

(30) Foreign Application Priority Data

Feb. 14, 2023      (JP) ................................. 2023-020942

(51) Int. Cl.

| | |
|---|---|
| *G11C 11/4096* | (2006.01) |
| *G11C 11/4076* | (2006.01) |
| *G11C 16/04* | (2006.01) |
| *G11C 16/26* | (2006.01) |
| *G11C 29/52* | (2006.01) |
| *G11C 11/56* | (2006.01) |

(52) U.S. Cl.
CPC ...... *G11C 11/4096* (2013.01); *G11C 11/4076* (2013.01); *G11C 16/0483* (2013.01); *G11C 16/26* (2013.01); *G11C 29/52* (2013.01); *G11C 11/5642* (2013.01)

(58) Field of Classification Search
CPC . G11C 16/0483; G11C 16/3427; G11C 16/26; G11C 16/08; G11C 16/30; G11C 16/16; G11C 16/24
See application file for complete search history.

(56) References Cited

U.S. PATENT DOCUMENTS

| | | | |
|---|---|---|---|
| 9,679,660 B1* | 6/2017 | Bae ........................ | G11C 16/08 |
| 2008/0180999 A1 | 7/2008 | Cohen | |
| 2019/0294367 A1* | 9/2019 | Takada .................... | G11C 16/10 |
| 2020/0019461 A1* | 1/2020 | Sugiyama ........... | G06F 11/1048 |
| 2020/0090763 A1* | 3/2020 | Tokutomi ............. | G06F 3/0679 |
| 2020/0211654 A1* | 7/2020 | Asami .................... | G11C 29/52 |
| 2021/0065771 A1* | 3/2021 | Hashimoto ........... | G11C 16/34 |

(Continued)

OTHER PUBLICATIONS

Attached NPL "EPO-Application-No-24-156-225.5" (Year: 2024).*
EPO office action (Year: 2024).*

*Primary Examiner* — Mushfique Siddique
(74) *Attorney, Agent, or Firm* — Maier & Maier, PLLC

(57) ABSTRACT
A memory system includes: a non-volatile memory including blocks each including memory cells; and a memory controller configured to execute a first read process of reading data from a first memory cell in a first block by using a first voltage and a second read process of reading data from a second memory cell in the first block by using a second voltage. The memory controller is configured to: maintain, when a first condition is satisfied, a difference between the first and second voltages at a first value, and change both the first and second voltages; and change, when a second condition is satisfied after the first condition has been satisfied, a difference between the first and second voltages from the first value to a second value, and change at least one of the first and second voltages.

16 Claims, 13 Drawing Sheets

(56) References Cited

U.S. PATENT DOCUMENTS

| | | | |
|---|---|---|---|
| 2021/0357289 A1 | 11/2021 | Kurose et al. | |
| 2022/0027083 A1 | 1/2022 | Zuolo et al. | |
| 2022/0093181 A1* | 3/2022 | Komatsu | G11C 16/0483 |
| 2022/0093182 A1* | 3/2022 | Kuribara | G06F 3/0619 |
| 2022/0293204 A1 | 9/2022 | Takeda et al. | |
| 2022/0375530 A1* | 11/2022 | Muchherla | G11C 29/021 |

* cited by examiner

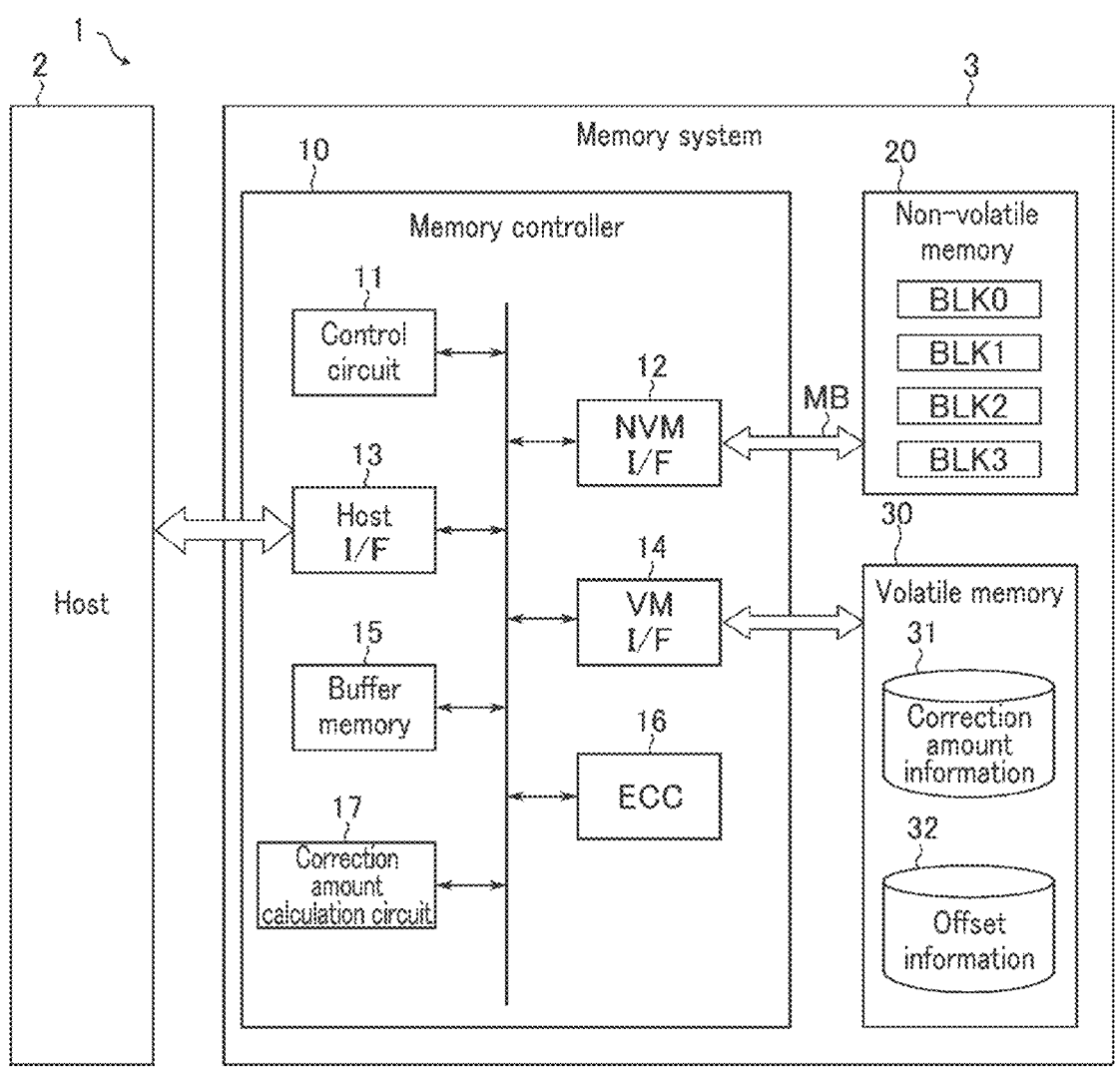
F I G. 1
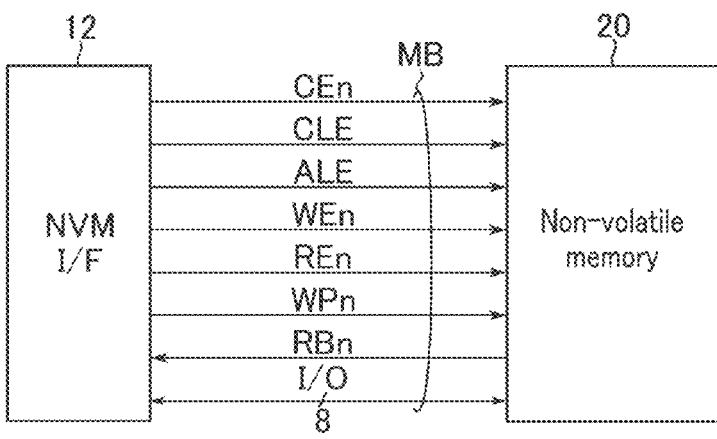
F I G. 2

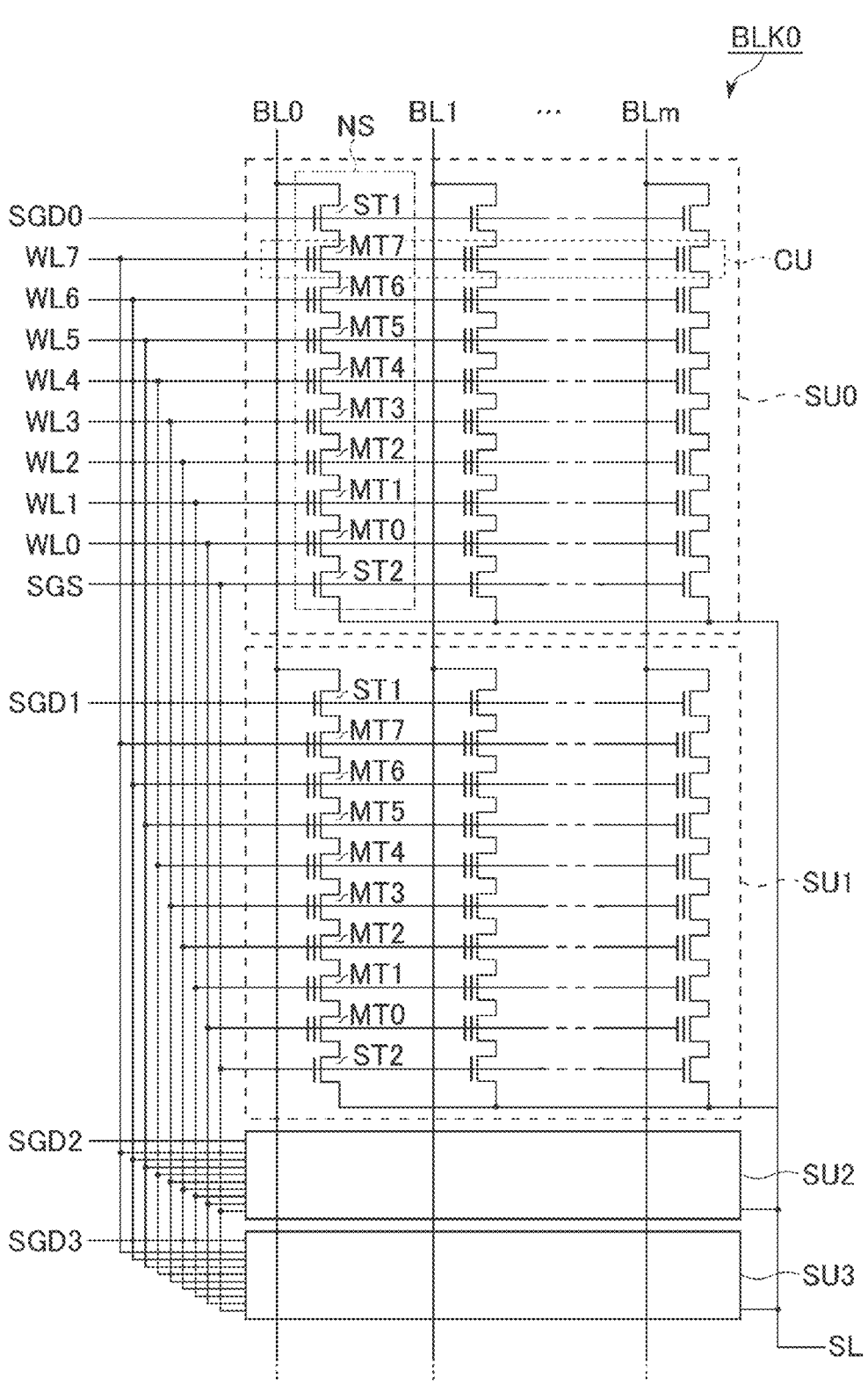
F I G. 3

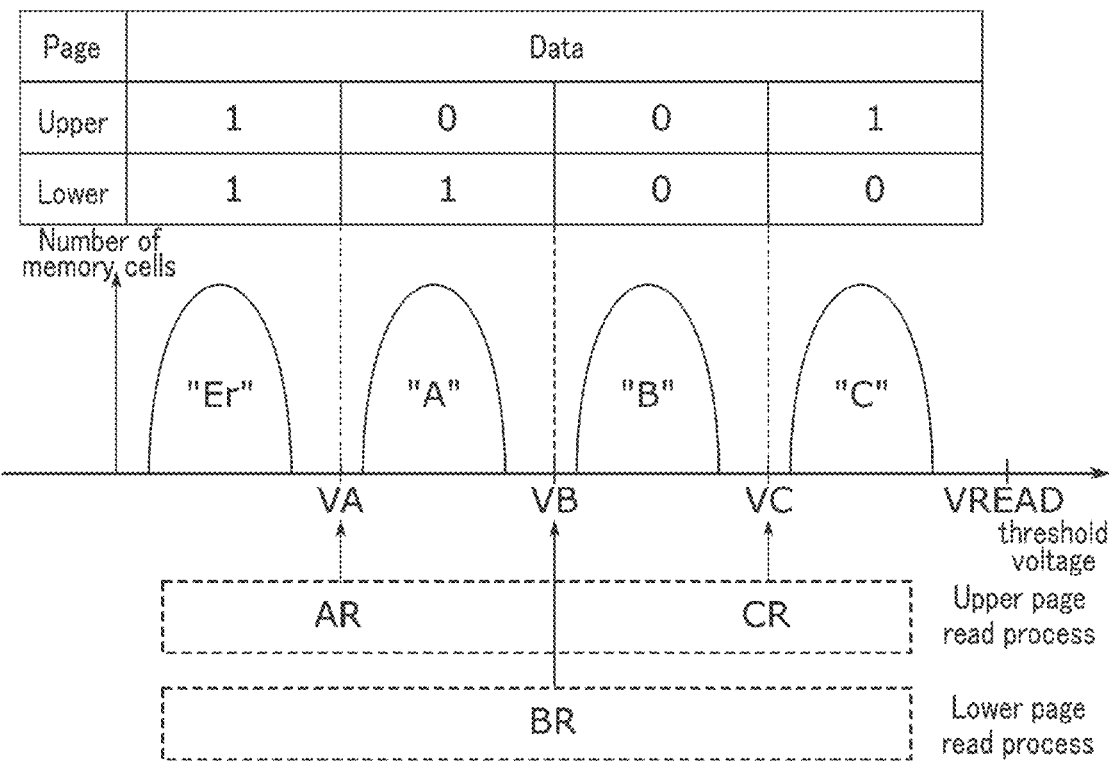
| Page | Data | | | |
|---|---|---|---|---|
| Upper | 1 | 0 | 0 | 1 |
| Lower | 1 | 1 | 0 | 0 |
F I G. 4
| | Standard correction amount | | | Offset table |
|---|---|---|---|---|
| | AR | BR | CR | |
| BLK0 | ΔVA0 | ΔVB0 | ΔVC0 | TBa |
| BLK1 | ΔVA1 | ΔVB1 | ΔVC1 | TBa |
| BLK2 | ΔVA2 | ΔVB2 | ΔVC2 | TBb |
| BLK3 | ΔVA3 | ΔVB3 | ΔVC3 | TBb |
F I G. 5

32

| | Word line | Offset correction amount | | |
|---|---|---|---|---|
| | | AR | BR | CR |
| TBa | WL7 (Reference WL) | $\delta$ VA7a | $\delta$ VB7a | $\delta$ VC7a |
| | WL6 | $\delta$ VA6a | $\delta$ VB6a | $\delta$ VC6a |
| | WL5 | $\delta$ VA5a | $\delta$ VB5a | $\delta$ VC5a |
| | WL4 | $\delta$ VA4a | $\delta$ VB4a | $\delta$ VC4a |
| | WL3 (Standard WL) | 0 | 0 | 0 |
| | WL2 | $\delta$ VA2a | $\delta$ VB2a | $\delta$ VC2a |
| | WL1 | $\delta$ VA1a | $\delta$ VB1a | $\delta$ VC1a |
| | WL0 | $\delta$ VA0a | $\delta$ VB0a | $\delta$ VC0a |
| TBb | WL7 | $\delta$ VA7b | $\delta$ VB7b | $\delta$ VC7b |
| | ⋮ | ⋮ | ⋮ | ⋮ |
| ⋮ | ⋮ | ⋮ | ⋮ | ⋮ |

F I G. 6

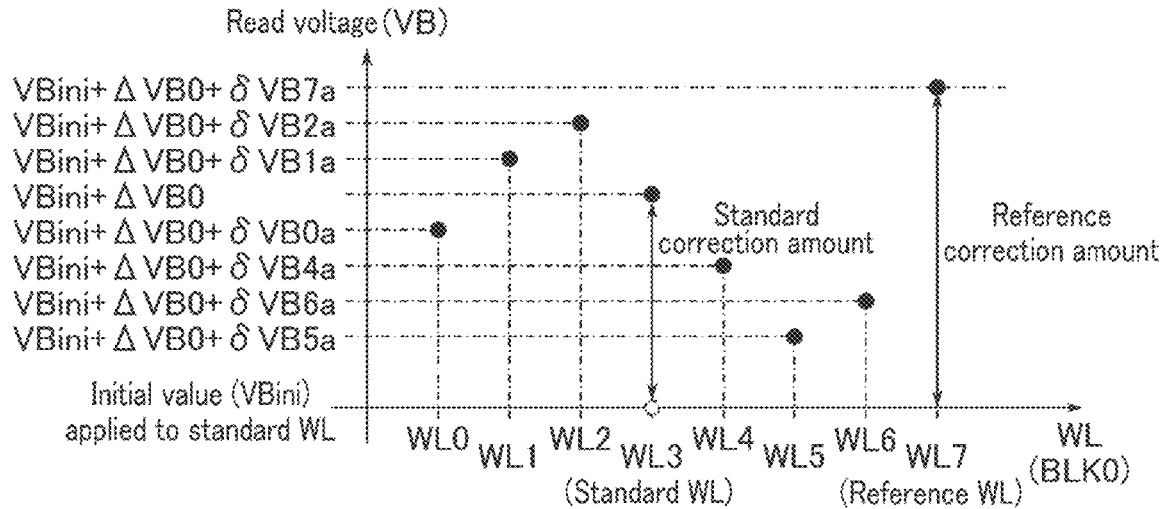

F I G. 7

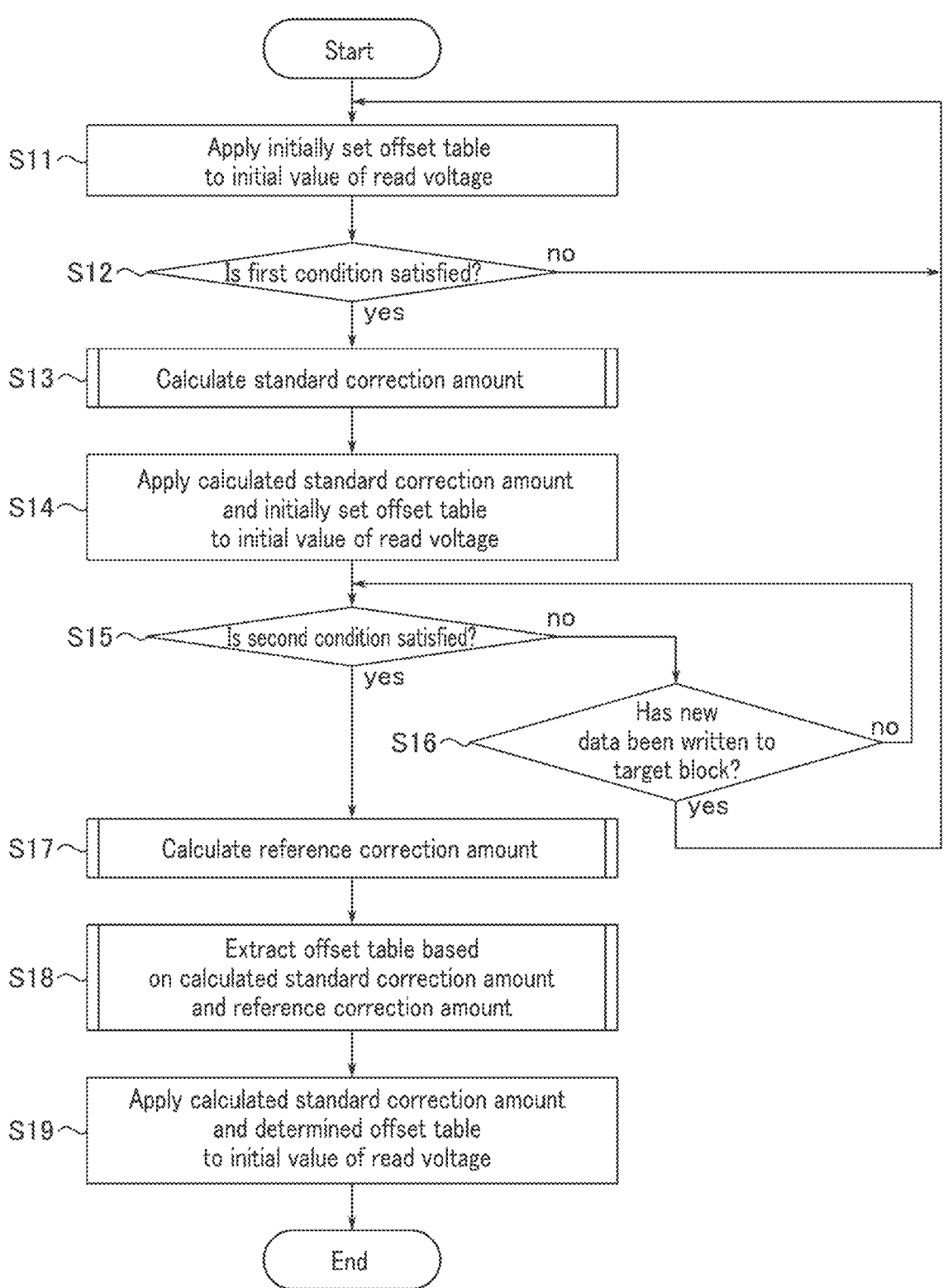
F I G. 8

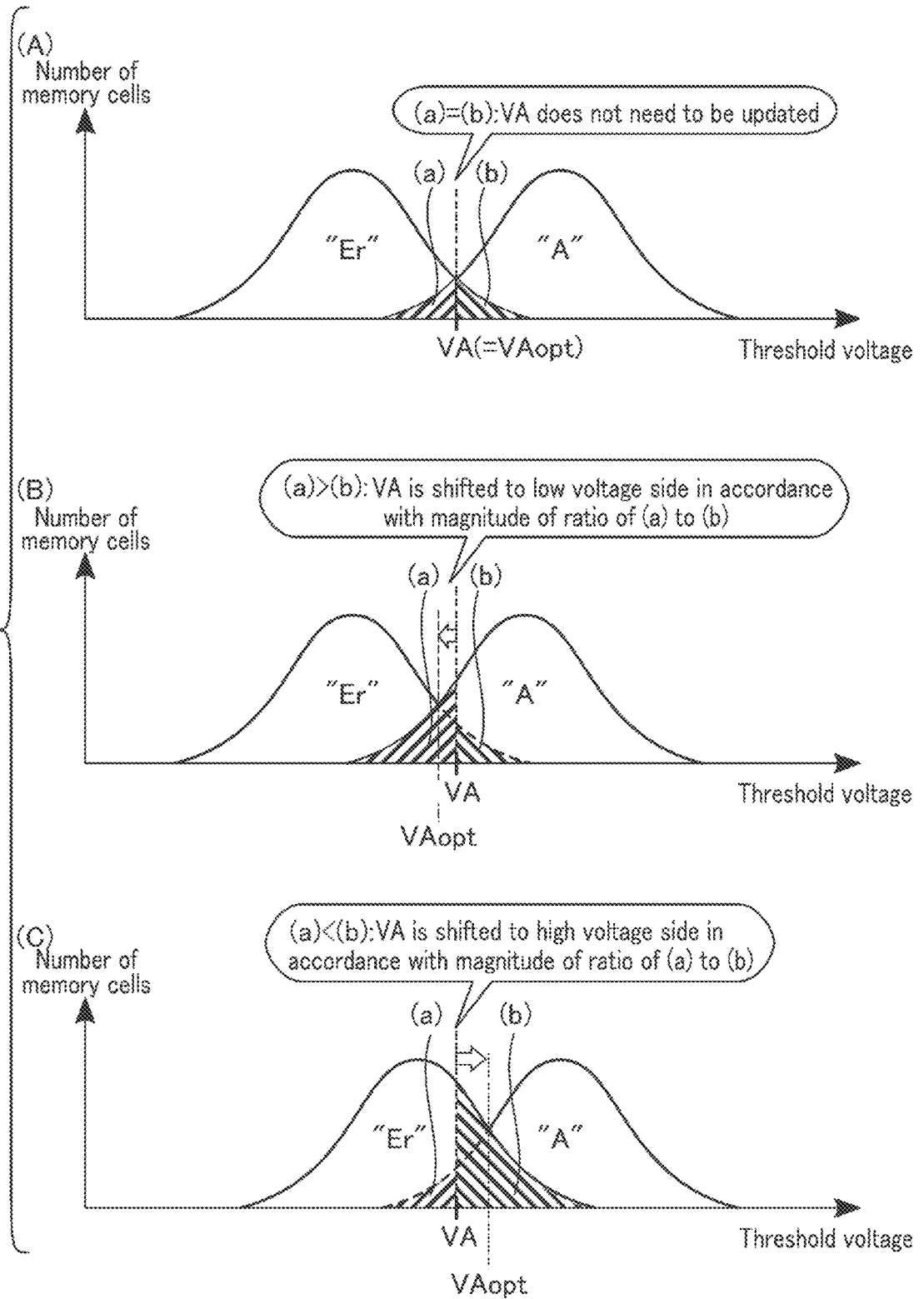
F I G. 9

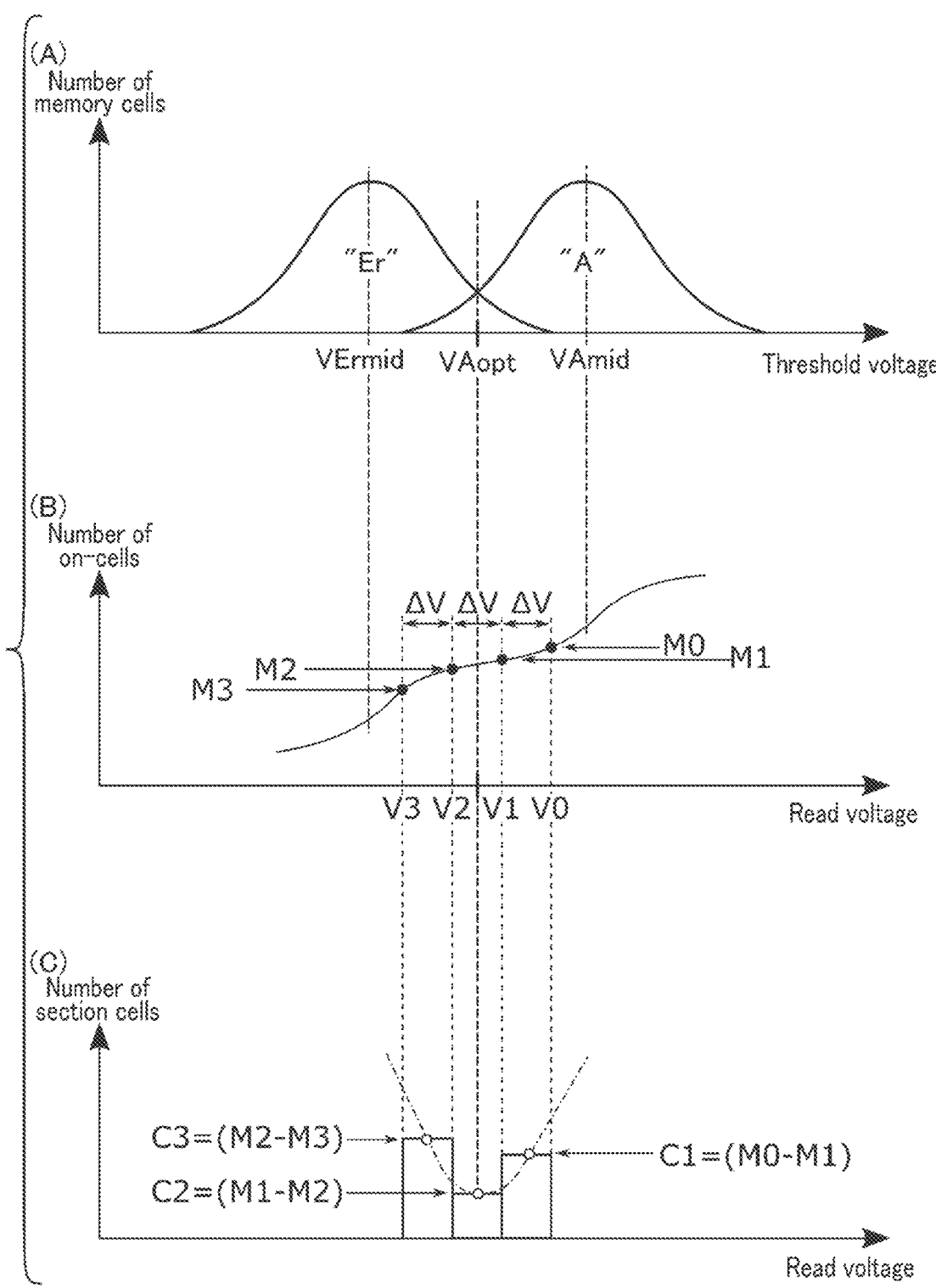
F I G. 10

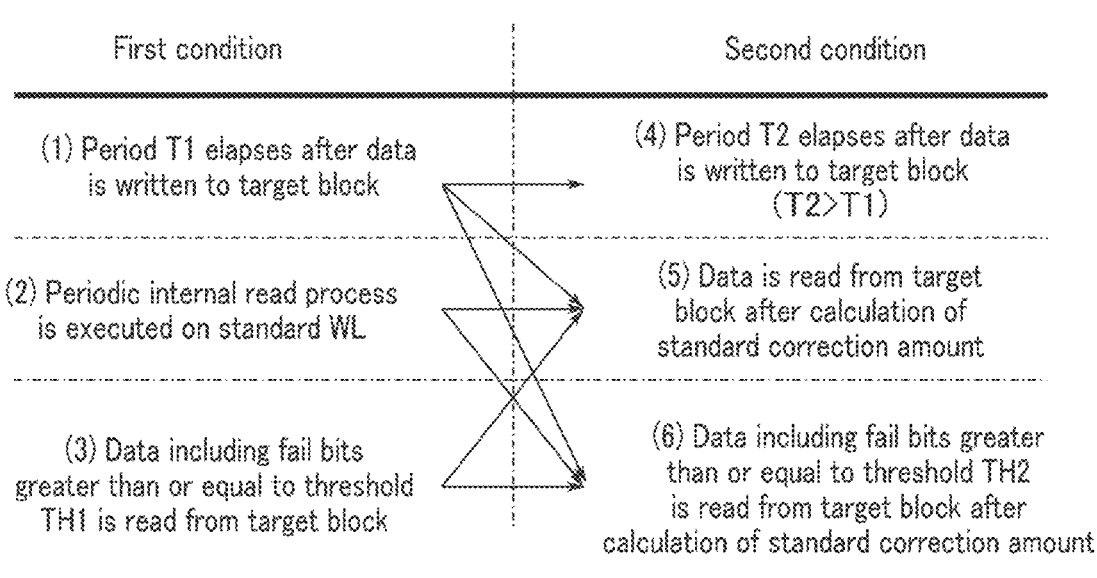

| First condition | Second condition |
|---|---|
| (1) Period T1 elapses after data is written to target block | (4) Period T2 elapses after data is written to target block (T2>T1) |
| (2) Periodic internal read process is executed on standard WL | (5) Data is read from target block after calculation of standard correction amount |
| (3) Data including fail bits greater than or equal to threshold TH1 is read from target block | (6) Data including fail bits greater than or equal to threshold TH2 is read from target block after calculation of standard correction amount |

FIG. 11

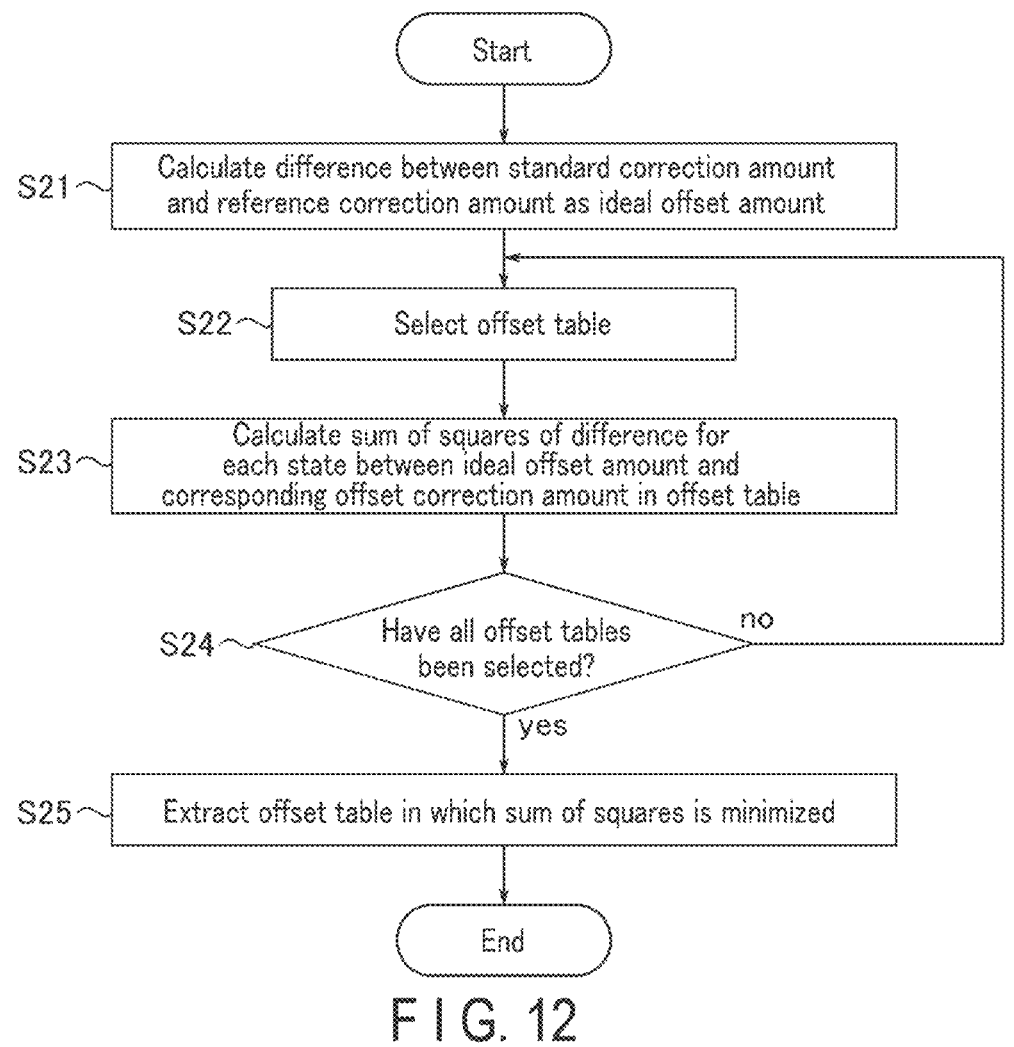

Start

S21 — Calculate difference between standard correction amount and reference correction amount as ideal offset amount S22 — Select offset table S23 — Calculate sum of squares of difference for each state between ideal offset amount and corresponding offset correction amount in offset table S24 — Have all offset tables been selected?　no yes S25 — Extract offset table in which sum of squares is minimized End

FIG. 12

Calculation of standard correction amount (BLK0, TBa)

Calculation of reference correction amount
(BLK0, TBa→TBc)

Calculation of standard correction amount (BLK1, TBa)
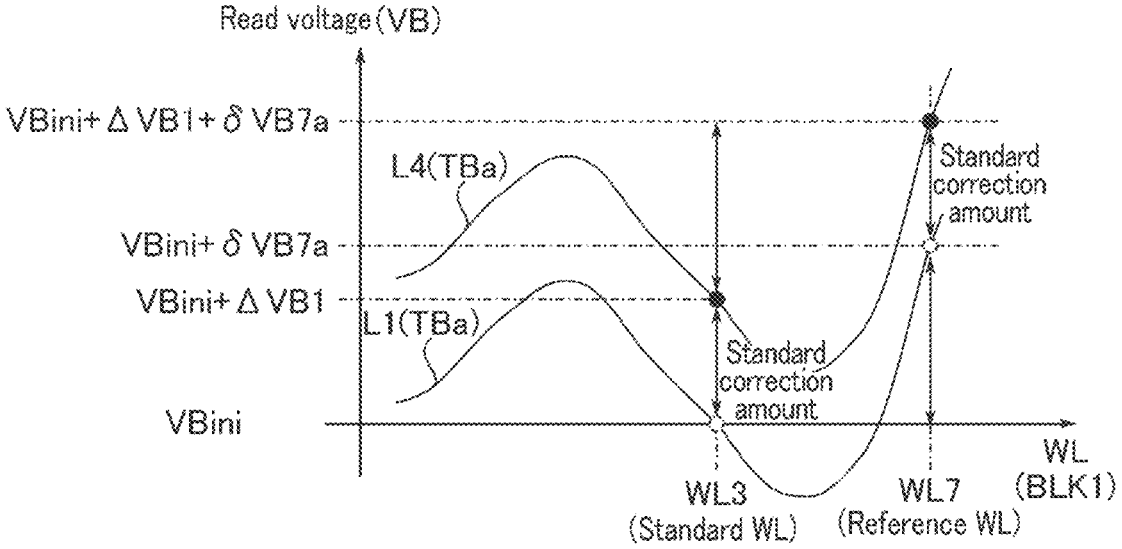
F I G. 15
Calculation of reference correction amount
(BLK1, TBa→TBd)
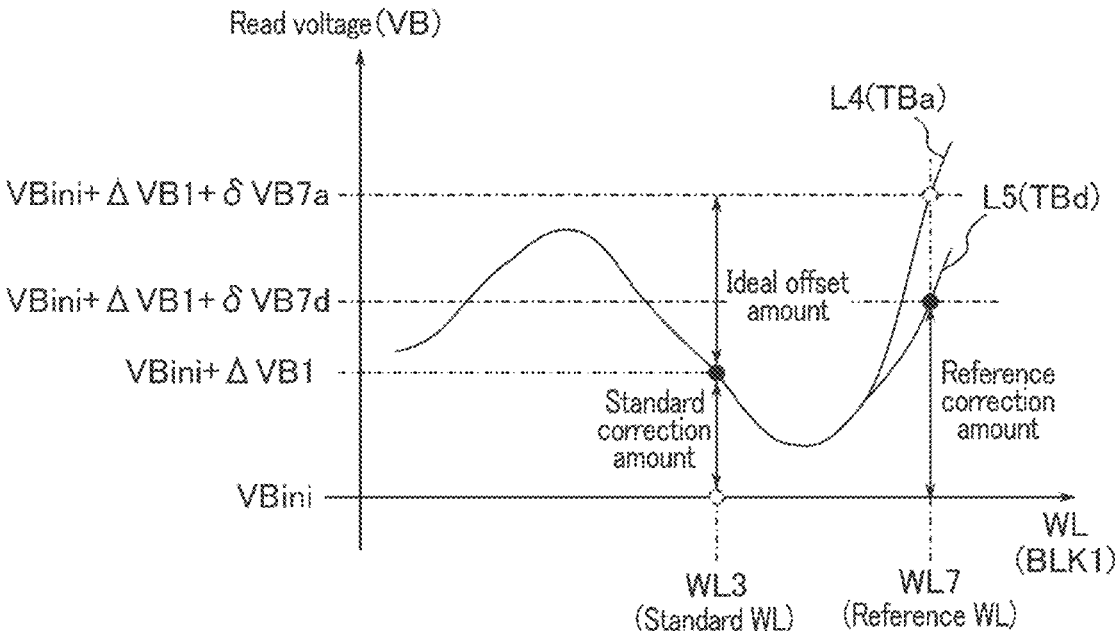
F I G. 16

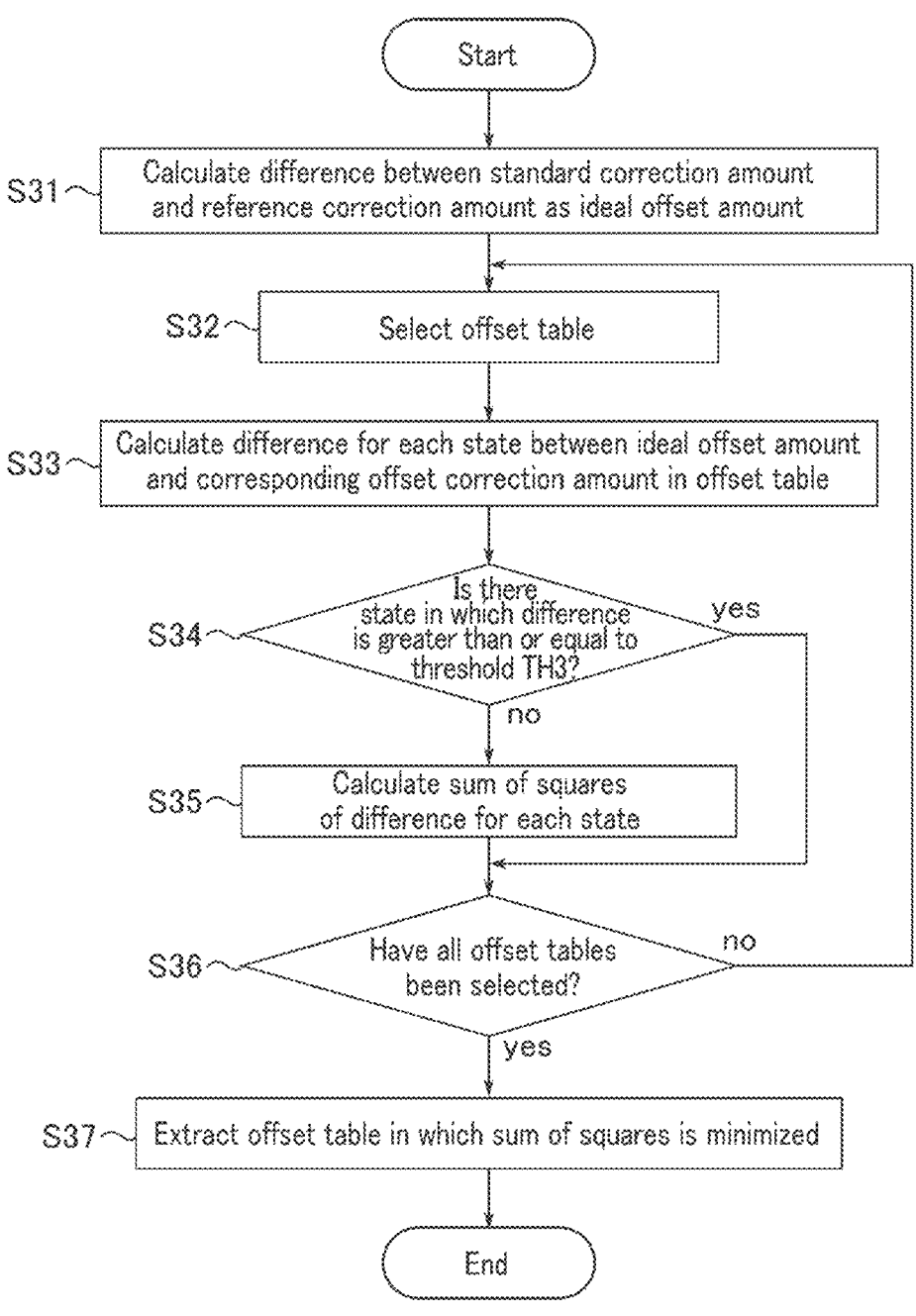
F I G. 17

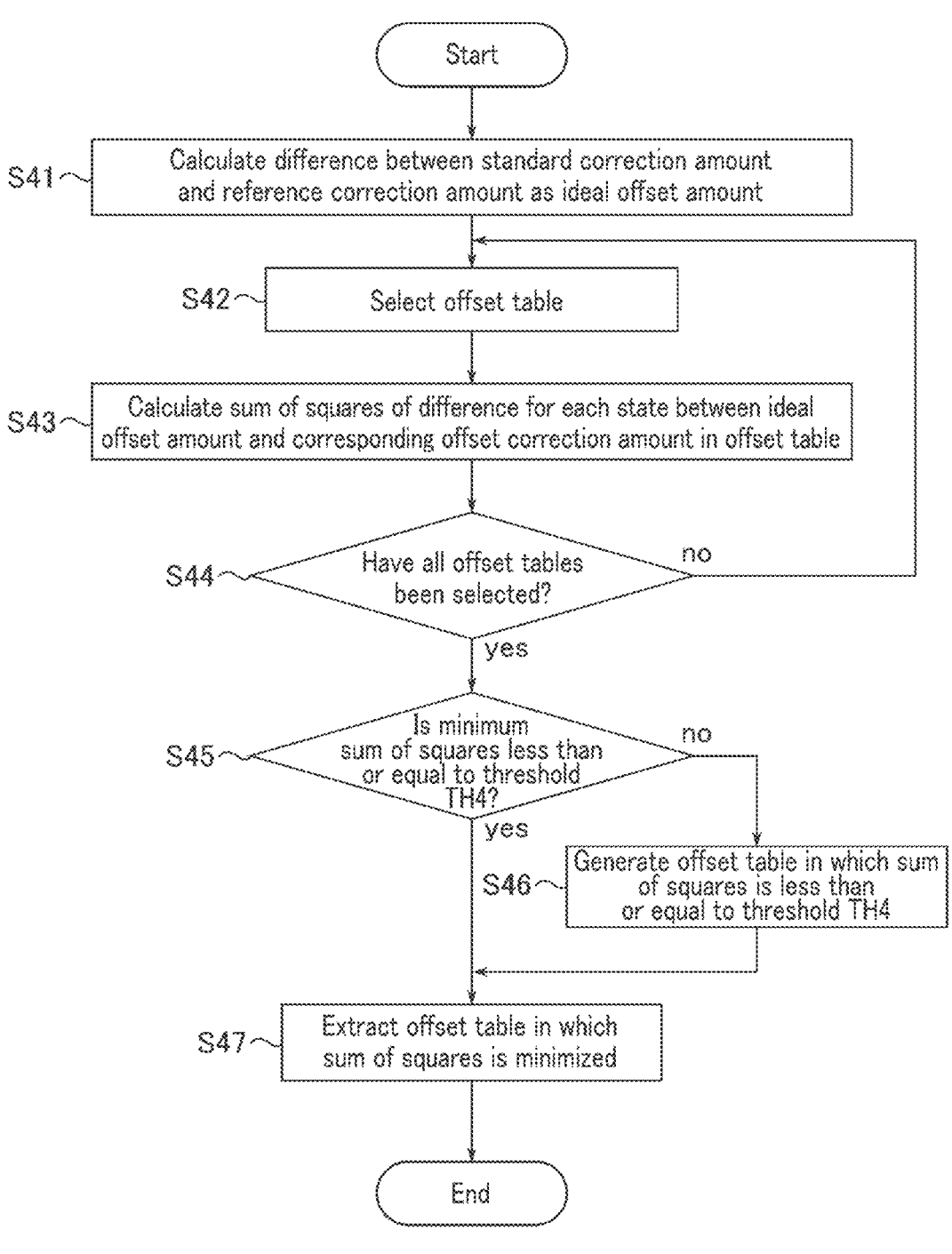
F I G. 18

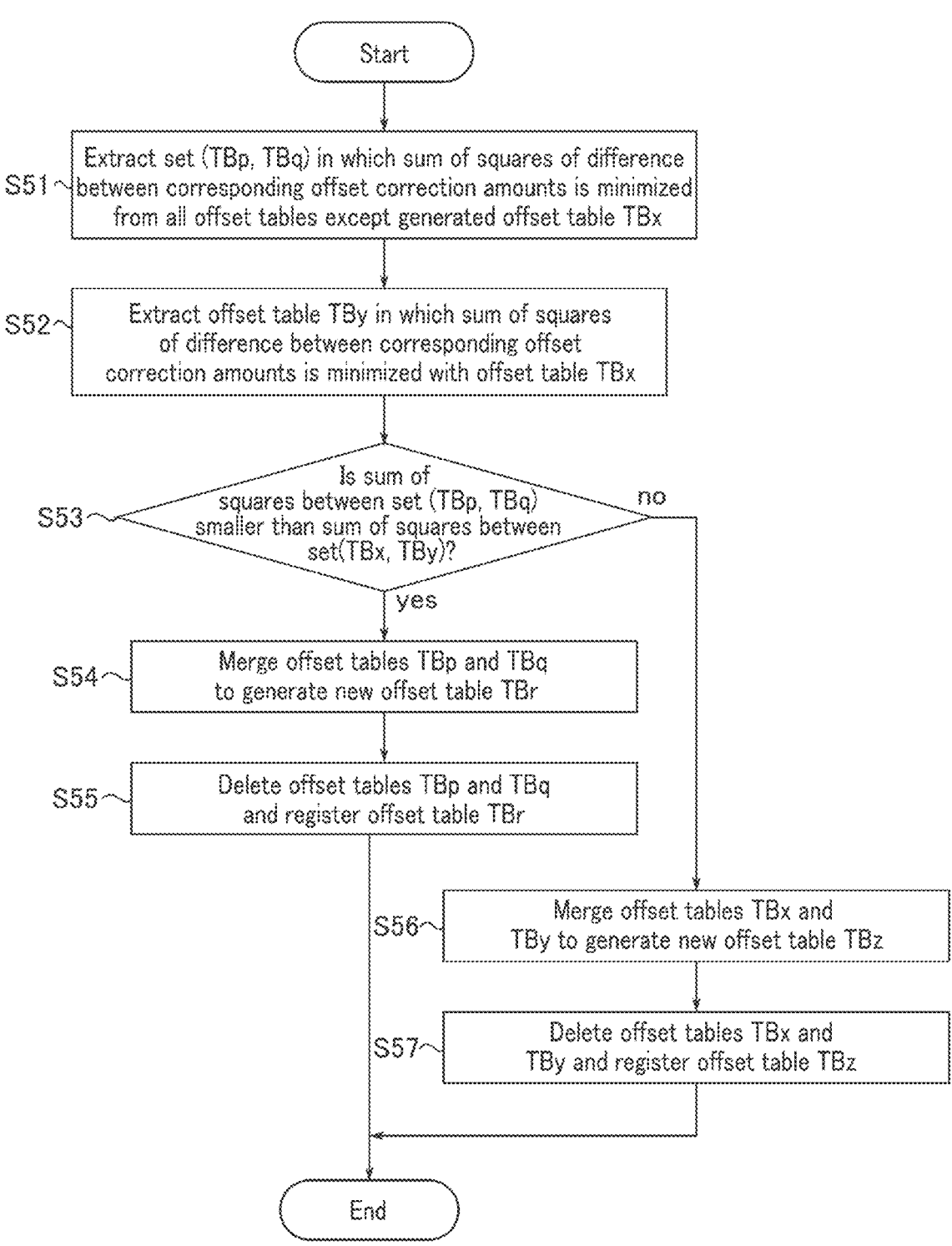
F I G. 19

MEMORY SYSTEM APPLYING READ VOLTAGE FOR READING DATA WITH SMALL NUMBER OF FAIL BITS

CROSS-REFERENCE TO RELATED APPLICATIONS

This application is based upon and claims the benefit of priority from Japanese Patent Application No. 2023-020942, filed Feb. 14, 2023, the entire contents of which are incorporated herein by reference.

FIELD

Embodiments described herein relate generally to a memory system.

BACKGROUND

A memory system is known which includes a NAND flash memory as a non-volatile memory and a memory controller that controls the non-volatile memory. The memory controller has a function of calculating an appropriate read voltage for reading data having a small number of fail bits from the non-volatile memory.

BRIEF DESCRIPTION OF DRAWINGS

FIG. 1 is a block diagram illustrating an example of a configuration of an information processing system according to a first embodiment.

FIG. 2 is a block diagram illustrating an example of signals used in a memory bus according to the first embodiment.

FIG. 3 is a circuit diagram illustrating an example of a configuration of a non-volatile memory according to the first embodiment.

FIG. 4 is a diagram illustrating an example of a threshold voltage distribution of a plurality of memory cell transistors according to the first embodiment.

FIG. 5 is a diagram illustrating an example of a configuration of correction amount information stored in a memory system according to the first embodiment.

FIG. 6 is a diagram illustrating an example of a configuration of offset information stored in the memory system according to the first embodiment.

FIG. 7 is a diagram illustrating an example of a read voltage applied in a read process in the memory system according to the first embodiment.

FIG. 8 is a flowchart illustrating an example of a correction amount application process in the memory system according to the first embodiment.

FIG. 9 is a diagram illustrating an example of a first method applied to a correction amount calculation process in the memory system according to the first embodiment.

FIG. 10 is a diagram illustrating an example of a second method applied to the correction amount calculation process in the memory system according to the first embodiment.

FIG. 11 is a diagram illustrating an example of a combination of generation conditions of the correction amount application process in the memory system according to the first embodiment.

FIG. 12 is a flowchart illustrating an example of an offset table extraction process in the memory system according to the first embodiment.

FIG. 15 is a diagram illustrating a third example of the transition of the correction amount applied in the correction amount application process in the memory system according to the first embodiment.

FIG. 16 is a diagram illustrating a fourth example of the transition of the correction amount applied in the correction amount application process in the memory system according to the first embodiment.

FIG. 17 is a flowchart illustrating an example of an offset table extraction process in a memory system according to a modification of the first embodiment.

FIG. 18 is a flowchart illustrating an example of an offset table extraction process in a memory system according to a second embodiment.

FIG. 19 is a flowchart illustrating an example of an offset table merge process in a memory system according to a modification of the second embodiment.

DETAILED DESCRIPTION

Figure 13:
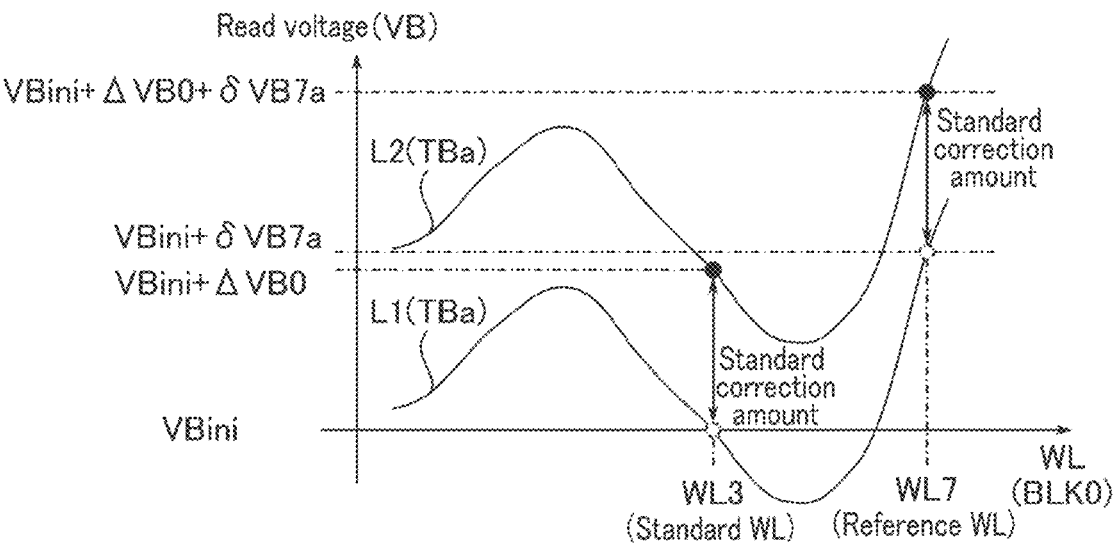
FIG. 13 is a diagram illustrating a first example of a transition of a correction amount applied in the correction amount application process in the memory system according to the first embodiment.

In general, according to one embodiment, a memory system includes a non-volatile memory including a plurality of blocks each including a plurality of memory cells; and a memory controller configured to execute a first read process of reading data from a first memory cell in a first block by using a first read voltage and a second read process of reading data from a second memory cell in the first block by using a second read voltage. The memory controller is configured to: maintain, in a case where a first condition is satisfied, a difference between the first read voltage and the second read voltage at a first value, and change both the first read voltage and the second read voltage; and change, in a case where a second condition is satisfied after the first condition has been satisfied, a difference between the first read voltage and the second read voltage from the first value to a second value different from the first value, and change at least one of the first read voltage and the second read voltage.

Embodiments will be described below with reference to the drawings. Note that, in the following description, components having the same functions and configurations are denoted by common reference numerals. In addition, in a case where a plurality of components having a common reference numeral is distinguished from each other, a suffix is added to the common reference numeral to make a distinction. Note that, in a case where it is not particularly necessary to distinguish a plurality of components, only a common reference numeral is assigned to the plurality of components, and a suffix is not added.

1. First Embodiment 1.1 Configuration 1.1.1 Information Processing System

A configuration of the information processing system according to a first embodiment will be described.

FIG. 1 is a block diagram illustrating an example of a configuration of an information processing system according to the first embodiment. As illustrated in FIG. 1, an information processing system 1 includes a host 2 and a memory system 3.

The host 2 is a data processing device that processes data using the memory system 3. The host 2 is, for example, a personal computer or a server in a data center.

The memory system 3 is a storage device configured to be connected to the host 2. The memory system 3 is, for example, a memory card such as an SD™ card, a universal flash storage (UFS), or a solid state drive (SSD). The memory system 3 executes a data write process, a data read process, and a data erase process in response to a request from the host 2. The memory system 3 may execute a write process, a read process, and an erase process as an internal process. The internal process is the process executed in the memory system 3 without depending on a request from the host 2.

1.1.2 Memory System

An internal configuration of the memory system according to the first embodiment will be described.

The memory system 3 includes a memory controller 10, a non-volatile memory 20, and a volatile memory 30.

The memory controller 10 is configured by an integrated circuit such as a system-on-a-chip (SoC). The memory controller 10 controls the non-volatile memory 20 based on a request from the host 2.

Specifically, the memory controller 10 writes write data to the non-volatile memory 20 based on a write request from the host 2, for example. The memory controller 10 also reads read data from the non-volatile memory 20 based on a read request from the host 2. The memory controller 10 then transmits data based on the read data to the host 2.

The non-volatile memory 20 is, for example, a NAND flash memory. The non-volatile memory 20 includes a plurality of blocks BLK (BLK0 to BLK3). Each block BLK includes a plurality of memory cells. Each memory cell stores data in a non-volatile manner. The block BLK is, for example, a unit of erasing data.

The volatile memory 30 is, for example, a dynamic random access memory (DRAM). The volatile memory 30 stores information related to a read voltage used at the time of reading data from the non-volatile memory 20. Specifically, the volatile memory 30 stores correction amount information 31 and offset information 32, for example. Note that the correction amount information 31 and the offset information 32 may be stored in the non-volatile memory 20. Details of the correction amount information 31 and the offset information 32 will be described later.

1.1.3 Memory Controller

The internal configuration of the memory controller 10 will now be described with continuing reference to FIG. 1. The memory controller 10 includes a control circuit 11, a non-volatile memory interface circuit (NVM I/F) 12, a host interface circuit (host I/F) 13, a volatile memory interface circuit (VM I/F) 14, a buffer memory 15, an error correction and check (ECC) circuit 16, and a correction amount calculation circuit 17. Functions of the control circuit 11, the non-volatile memory interface circuit 12, the host interface circuit 13, the volatile memory interface circuit 14, the buffer memory 15, the error check and correction circuit 16, and the correction amount calculation circuit 17, which will be described below, can be realized by any of dedicated hardware, a processor that executes a program, or a combination thereof.

The control circuit 11 is a circuit that controls the entire memory controller 10. The control circuit 11 includes, for example, a processor such as a central processing unit (CPU), a read only memory (ROM), and a random access memory (RAM).

The non-volatile memory interface circuit 12 controls communication between the memory controller 10 and the non-volatile memory 20. The non-volatile memory interface circuit 12 is connected to the non-volatile memory 20 via a memory bus MB. The memory bus MB conforms to, for example, a single data rate (SDR) interface, a toggle double data rate (DDR) interface, or an open NAND flash interface (ONFI).

The host interface circuit 13 controls communication between the memory controller 10 and the host 2. The host interface circuit 13 is connected to the host 2 via a host bus. The host bus conforms to, for example, an SD™ interface, SAS (Serial Attached SCSI (Small Computer System Interface)), SATA (Serial ATA (Advanced Technology Attachment)), or PCIe™ (Peripheral Component Interconnect express).

The volatile memory interface circuit 14 controls communication between the memory controller 10 and the volatile memory 30. The bus connecting between the volatile memory 30 and the memory controller 10 conforms to, for example, the DRAM interface standard.

The buffer memory 15 is, for example, a static random access memory (SRAM). The buffer memory 15 buffers data between the host 2 and the non-volatile memory 20. Specifically, the buffer memory 15 temporarily stores write data and read data.

The error check and correction circuit 16 performs an error detection process and an error correction process about data stored in the non-volatile memory 20. In other words, at the time of the data write process, the error check and correction circuit 16 adds an error correction code to the write data. At the time of the data read process, the error check and correction circuit 16 decodes the read data and detects the presence or absence of a fail bit. The fail bit is a bit different from data written in a certain memory cell among data (including one or more bits) read from the memory cell. When a fail bit is detected, the error check and correction circuit 16 specifies the position of the fail bit and executes an error correction process. The method of the error correction process includes, for example, hard bit decoding and soft bit decoding. For example, a Bose-Chaudhuri-Hocquenghem (BCH) code, a Reed-Solomon (RS) code, or the like can be used as a hard bit decoding code used for hard bit decoding, and, for example, a low density parity check (LDPC) code or the like can be used as a soft bit decoding code used for soft bit decoding. In the following, unless otherwise specified, it is assumed that hard bit decoding is applied to an error correction process.

The correction amount calculation circuit 17 is a circuit configured to execute a correction amount calculation process. The correction amount calculation process is a process of calculating a difference (correction amount) between an initial value of the read voltage and an appropriate read voltage. The correction amount calculation circuit 17 executes a correction amount calculation process using one or more of pieces of read data from the non-volatile memory 20. The correction amount calculation circuit 17 may execute a correction amount calculation process by further using the result of an error detection process by the error check and correction circuit 16.

1.1.4 Memory Bus

An example of signals exchanged between the non-volatile memory 20 and the memory controller 10 will now be described. FIG. 2 is a block diagram illustrating an example of signals used in the memory bus according to the first embodiment.

The signals used in the memory bus MB include, for example, a chip enable signal CEn, a command latch enable signal CLE, an address latch enable signal ALE, a write enable signal WEn, a read enable signal REn, a write protect signal WPn, a ready/busy signal RBn, and an input/output signal I/O. In this specification, "n" at the end of the name of a signal means that the signal is asserted when the signal is at an "L (Low)" level.

The chip enable signal CEn is a signal for enabling the non-volatile memory 20.

The command latch enable signal CLE and the address latch enable signal ALE are signals for notifying the non-volatile memory 20 that the input signal I/O to the non-volatile memory 20 is a command and an address, respectively.

The write enable signal WEn is a signal for causing the non-volatile memory 20 to take in the input signal I/O.

The read enable signal REn is a signal for reading the output signal I/O from the non-volatile memory 20.

The write protect signal WPn is a signal for instructing the non-volatile memory 20 to prohibit writing and erasing data.

The ready/busy signal RBn is a signal indicating whether the non-volatile memory 20 is in a ready state or a busy state. The ready state is a state in which the non-volatile memory 20 can receive an instruction from the memory controller 10. The busy state is a state in which the non-volatile memory 20 cannot receive an instruction from the memory controller 10. The "L" level of the ready/busy signal RBn indicates a busy state.

The input/output signal I/O is, for example, an 8-bit signal. The input/output signal I/O is an entity of data transmitted and received between the non-volatile memory 20 and the memory controller 10. The input/output signal I/O includes a command, an address, and data such as write data and read data.

1.1.5 Non-Volatile Memory

The configuration of the non-volatile memory 20 will now be described. FIG. 3 is a circuit diagram illustrating an example of the configuration according to the first embodiment. FIG. 3 illustrates a configuration of the block BLK0 as an example. The configurations of the other blocks BLK1 to BLK3 are equivalent to the configuration of the block BLK0. The block BLK0 includes, for example, four string units SU0 to SU3. Note that in FIG. 3, the configurations of the string units SU2 and SU3 are illustrated in a simplified manner.

Each string unit SU includes a plurality of NAND strings NS associated with bit lines BL0, BL1, . . . , and BLm (m is an integer of 2 or more), respectively. The NAND string NS includes, for example, memory cell transistors MT0 to MT7 and select transistors ST1 and ST2.

The memory cell transistor MT includes a control gate and a charge storage layer, and stores data in a non-volatile manner. Each of the select transistors ST1 and ST2 is used to select the string unit SU in various types of processes.

In each NAND string NS, the memory cell transistors MT0 to MT7 are coupled in series. The select transistor ST1 is coupled between one end of the memory cell transistors MT0 to MT7 coupled in series and the associated bit line BL. The drain of the select transistor ST2 is coupled to the other end of the memory cell transistors MT0 to MT7 coupled in series. A source line SL is coupled to the source of the select transistor ST2.

In the same block BLK, the gates of the plurality of select transistors ST1 included in the string units SU0 to SU3 are commonly coupled to select gate lines SGD0 to SGD3, respectively. The control gates of the plurality of memory cell transistors MT0 to MT7 are commonly coupled to word lines WL0 to WL7, respectively. Each gate of the plurality of select transistors ST2 is commonly coupled to a select gate line SGS.

The bit lines BL0 to BLm are shared by the plurality of blocks BLK0 to BLK3. The same bit line BL is coupled to the NAND strings NS corresponding to the same column address. Each of the word lines WL0 to WL7 is provided in each of the blocks BLK0 to BLK3. The source line SL is shared by, for example, the plurality of blocks BLK0 to BLK3.

A collection of a plurality of memory cell transistors MT coupled to a common word line WL in one string unit SU is referred to as, for example, a cell unit CU and is used as a unit of writing data. For example, the storage capacity of the cell unit CU including the memory cell transistors MT each storing 1-bit data is defined as "one-page data". In other words, one-page data is a data region of 1-bit data string having the number of columns corresponding to the number of memory cell transistors MT in the cell unit CU. The one-page data is used as, for example, a unit of reading data. The cell unit CU may have a storage capacity of two or more pages of data depending on the number of bits of data stored in the memory cell transistor MT.

Note that the circuit configuration of the block BLK described above is merely an example, and is not limited thereto. For example, the number of bit lines BL is not limited to three or more, and may be one or two. The number of blocks BLK included in the non-volatile memory 20 may be designed to be any number. The number of string units SU included in each block BLK may be designed to be any number. The number of each of the memory cell transistors MT and the select transistors ST1 and ST2 included in each NAND string NS may be designed to be any number.

In the following, a case where one memory cell transistor MT can store 2-bit data will be described. In this case, a write mode in which 2-bit data is stored in the memory cell transistor MT is also referred to as a multi level cell (MLC) mode. The 2-bit data written in the MLC mode and stored in the memory cell transistor is referred to as a lower bit and an upper bit in order from the lower bit. In addition, a collection of lower bits stored in the memory cell transistors MT included in the same cell unit CU is referred to as a "lower page", and a collection of upper bits is referred to as an "upper page".

FIG. 4 is a schematic diagram illustrating an example of a threshold voltage distribution of the plurality of memory cell transistors MT according to the first embodiment. When the memory cell transistor MT stores 2-bit data, the distribution of the threshold voltage is divided into four. The four threshold voltage distributions are referred to as an "Er" state, an "A" state, a "B" state, and a "C" state in ascending order of the threshold voltage.

Voltages VA, VB, and VC illustrated in FIG. 4 are each used to distinguish between two adjacent states in a read process. Voltage VREAD is a voltage applied to a non-selected word lines in a read process. When the voltage VREAD is applied to the gate of the memory cell transistor MT, the memory cell transistor MT is turned on regardless of stored data. The relationship between these voltage values is VA<VB<VC<VREAD.

The "Er" state in the above-described threshold voltage distribution corresponds to the erase state of the memory cell transistor MT. The threshold voltage in the "Er" state is less than the voltage VA. The threshold voltage in the "A" state is higher than or equal to the voltage VA and lower than the voltage VB. The threshold voltage in the "B" state is higher than or equal to the voltage VB and lower than the voltage VC. The threshold voltage in the "C" state is higher than or equal to the voltage VC and lower than the voltage VREAD.

The above-described four threshold voltage distributions are formed by writing 2-bit (two-page) data including a lower bit and an upper bit. The four threshold voltage distributions each correspond to different 2-bit data. In the following, it is assumed that data is allocated to the memory cell transistor MT included in each state in "upper bit/lower bit" as described below.

The memory cell transistor MT included in the "Er" state stores "11" data. The memory cell transistor MT included in the "A" state stores "01" data. The memory cell transistor MT included in the "B" state stores "00" data. The memory cell transistor MT included in the "C" state stores "10" data.

The read process of the lower page includes a read process BR in which the voltage VB for distinguishing the "A" state and the "B" state is used as a read voltage. The read process of the upper page includes a read process AR in which the voltage VA for distinguishing the "Er" state and the "A" state is used as a read voltage and a read process CR in which the voltage VC for distinguishing the "B" state and the "C" state is used as a read voltage.

Note that the memory controller 10 manages the read voltages VA, VB, and VC to be applied to a read process by digital to analogue converter (DAC) values indicating correction amounts from the initial values VAini, VBini, and VCini of the read voltages, respectively. The initial values VAini, VBini, and VCini of the read voltage are values commonly applied to all memory regions.

The correction amount is represented by a set including a standard correction amount and an offset table. The set including the standard correction amount and the offset table is independently applied to each predetermined memory region. The standard correction amount is a DAC value commonly applied to the corresponding predetermined memory region. The offset table is a set including DAC values (offset correction amounts) individually applied to the partial memory regions in the corresponding predetermined memory region. In the following, a case where the range of the predetermined memory region to which the set including the standard correction amount and the offset table is commonly applied is the block BLK, and the range of the partial memory region to which the offset correction amount is applied is the cell unit CU will be described, but the embodiment is not limited thereto. For example, a plurality of standard correction amounts may be applied to different memory regions in one block BLK. One standard correction amount may be applied to a plurality of blocks BLK. The offset correction amount may also be applied to a plurality of cell units CU.

1.1.6 Buffer Memory

FIG. 5 is a diagram illustrating an example of a configuration of correction amount information stored in the memory system according to the first embodiment. FIG. 6 is a diagram illustrating an example of a configuration of offset information stored in the memory system according to the first embodiment.

In the correction amount information 31, a set including DAC values indicating a standard correction amount applied to each block BLK and a pointer indicating an offset table applied to each block BLK is stored. A plurality of offset tables is stored in the offset information 32. In other words, the pointer of the offset table stored in the correction amount information 31 indicates one offset table among the plurality of offset tables stored in the offset information 32.

In the example of FIG. 5, with reference to the correction amount information 31, it can be seen that DAC values $\Delta VA0$, $\Delta VB0$, and $\Delta VC0$ are applied to the block BLK0 as the standard correction amount, and an offset table TBa is applied. It can also be seen that DAC values $\Delta VA1$, $\Delta VB1$, and $\Delta VC1$ are applied to the block BLK1 as the standard correction amount, and the offset table TBa is applied as the offset correction amount.

The offset table is information in which information in which (a word line WL corresponding to) a cell unit CU is associated with a DAC value for each state indicating an offset correction amount to be applied to the cell unit CU is collected in units of blocks BLK.

In the example of FIG. 6, when the offset table TBa is applied, DAC values $\delta VA0a$, $\delta VB0a$, and $\delta VC0a$ are applied as the offset correction amounts to the cell unit CU corresponding to the word line WL0. DAC values $\delta VA1a$, $\delta VB1a$, and $\delta VC1a$ are applied as the offset correction amounts to the cell unit CU corresponding to the word line WL1. DAC values $\delta VA2a$, $\delta VB2a$, and $\delta VC2a$ are applied as the offset correction amounts to the cell unit CU corresponding to the word line WL2. DAC values $\delta VA4a$, $\delta VB4a$, and $\delta VC4a$ are applied as the offset correction amounts to the cell unit CU corresponding to the word line WL4. DAC values $\delta VA5a$, $\delta VB5a$, and $\delta VC5a$ are applied as the offset correction amounts to the cell unit CU corresponding to the word line WL5. DAC values $\delta VA6a$, $\delta VB6a$, and $\delta VC6a$ are applied as the offset correction amounts to the cell unit CU corresponding to the word line WL6. DAC values $\delta VA7a$, $\delta VB7a$, and $\delta VC7a$ are applied as the offset correction amounts to the cell unit CU corresponding to the word line WL7. On the other hand, DAC values "0" are applied as the offset correction amounts to the cell unit CU corresponding to the word line WL3.

As described above, the word line WL (the word line WL3 in the example of FIG. 6) to which the DAC values "0" are applied among the word lines WL associated with the offset correction amounts in the offset table is hereinafter referred to as a "standard WL". In addition, one predetermined word line WL (the word line WL7 in the example of FIG. 6) other than the standard WL among the word lines WL associated with the offset correction amount in the offset table is hereinafter referred to as a "reference WL". In a correction amount application process to be described later, the standard WL is fixed. On the other hand, in a correction amount application process to be described later, the reference WL may be fixed or may be dynamically changed.

By combining the standard correction amount and the offset table as described above, the correction amount for the initial value of the read voltage for all the cell units CU in all the blocks BLK can be determined.

FIG. 7 is a diagram illustrating an example of a read voltage applied in the read process in the memory system according to the first embodiment. The example of FIG. 7 illustrates the read voltage VB applied to the block BLK0, which is determined based on the correction amount information 31 illustrated in FIG. 5 and the offset information 32 illustrated in FIG. 6.

The offset correction amount applied to the word line WL3 which is the standard WL is "0". Therefore, the read voltage VB applied to the word line WL3 is $VBini+\Delta VB0$. On the other hand, the read voltage VB applied to the word lines WLj (j=0 to 2 and 4 to 7) other than the standard WL is $VBini+\Delta VB0+\delta VBja$.

In the following, the difference of the read voltage applied to the standard WL from the initial value is referred to as a "standard correction amount". In addition, the difference of the read voltage applied to the reference WL from the initial value is referred to as a "reference correction amount". In other words, in the example of FIG. 7, the standard correction amount is ΔVB0, and the reference correction amount is ΔVB0+δVB7a.

1.2 Operation

An operation of the memory system according to the first embodiment will now be described.

1.2.1 Correction Amount Application Process

FIG. 8 is a flowchart illustrating an example of the correction amount application process in the memory system according to the first embodiment.

When data is written to the target block BLK (start), the control circuit 11 applies the initially set offset table to the initial value of the read voltage in the subsequent read process (S11).

The control circuit 11 determines whether or not the first condition is satisfied (S12). Details of the first condition will be described later.

If the first condition is not satisfied (S12; no), the control circuit 11 continues to apply the initially set offset table to the initial value of the read voltage (S11). The subsequent process in S12 is then executed. As described above, the process in S11 and the process in S12 are repeated until the first condition is satisfied.

If the first condition has been satisfied (S12; yes), the correction amount calculation circuit 17 calculates the standard correction amount by executing the correction amount calculation process for the standard WL (S13).

After the process in S13, the control circuit 11 changes the setting of the read voltage applied in the process in S11. In other words, the control circuit 11 applies the initially set offset table and the standard correction amount calculated in the process in S13 to the initial value of the read voltage in the subsequent read process (S14).

The control circuit 11 determines whether or not the second condition is satisfied (S15). Details of the second condition will be described later.

If the second condition is not satisfied (S15; no), the control circuit 11 determines whether or not new data has been written to the target block BLK (S16).

If no new data has been written to the target block BLK (S16; no), the control circuit 11 continues to determine whether or not the second condition is satisfied (S15). The subsequent process in S16 is then executed. As described above, if no new data has been written to the target block BLK, the process in S15 and the process in S16 are repeated until the second condition is satisfied.

If new data has been written to the target block BLK (S16; yes), the control circuit 11 applies the initially set offset table to the initial value of the read voltage (S11). The subsequent processes in S12 to S16 are then executed. As described above, if new data has been written to the target block BLK, the processes in S11 to S16 are repeated until the second condition is satisfied.

If the second condition has been satisfied (S15; yes), the correction amount calculation circuit 17 calculates the reference correction amount by executing the correction amount calculation process for the reference WL (S17).

The control circuit 11 extracts an offset table to be applied to the subsequent read process based on the standard correction amount calculated in the process in S13 and the reference correction amount calculated in the process in S17 (S18).

The control circuit 11 applies the standard correction amount calculated in the process in S13 and the offset table extracted in the process in S19 to the initial value of the read voltage in the subsequent read process (S19).

After the process in S19, the correction amount application process is ended (end).

1.2.2 Correction Amount Calculation Process

Details of the correction amount calculation process used for the calculation of the standard correction amount in the process in S13 and the calculation of the reference correction amount in the process in S17 will now be described. In the following, the correction amount calculation process based on the data read using the initial value of the read voltage will be described.

(First Method)

A first method will be described.

In the first method, the control circuit 11 executes, for example, a read process for all pages, on a predetermined string unit SU (e.g., the string unit SU0) coupled to the target word line WL. In other words, the control circuit 11 executes a read process on a predetermined string unit SU coupled to the standard WL when calculating the standard correction amount, and executes a read process on a predetermined string unit SU coupled to the reference WL when calculating the reference correction amount.

After the read process, the error check and correction circuit 16 executes an error detection process on the read data. Thus, the correction amount calculation circuit 17 can grasp the data string before correction and the data string after correction for each column address of the read data. Therefore, the correction amount calculation circuit 17 can grasp the (true) state at the time of writing and the (possibly erroneous) state at the time of reading for each column address of the read data. Specifically, for example, the correction amount calculation circuit 17 can grasp the number E12 of memory cells in which data written as the "A" state is erroneously read as the "Er" state. The correction amount calculation circuit 17 can also grasp the number E21 of memory cells in which data written as the "Er" state is erroneously read as the "A" state.

FIG. 9 is a diagram illustrating an example of the first method applied to the correction amount calculation process in the memory system according to the first embodiment. The example of FIG. 9 illustrates a case of calculating the correction amount of the read voltage VA. In FIG. 9, the number E12 of memory cells in which data written as the "A" state is erroneously read as the "Er" state corresponds to the areas of the regions (a) in portions (A), (B), and (C) of FIG. 9. The number E21 of memory cells in which data written as the "Er" state is erroneously read as the "A" state corresponds to the areas of the regions (b) in portions (A), (B), and (C) of FIG. 9.

The portion (A) of FIG. 9 illustrates a case where the read voltage VA is equal to a threshold voltage VAopt at the position where the two threshold voltage distributions corresponding to the "Er" state and the "A" state intersect. In the case of the portion (A) of FIG. 9, the area of the region (a) is equal to the area of the region (b). In this case, it is expected that the number E (=E12+E21) of fail bits generated between the "Er" state and the "A" state is minimized. Therefore, the correction amount calculation circuit 17 determines that the read voltage VA does not need to be updated. In other words, the correction amount calculation circuit 17 calculates the correction amount ΔVA of "0" (ΔVA=0).

The portion (B) of FIG. 9 illustrates a case where the read voltage VA is located on the higher voltage side than the threshold voltage VAopt at the position where the two threshold voltage distributions corresponding to the "Er" state and the "A" state intersect. In the case of the portion (B) of FIG. 9, the area of the region (a) is larger than the area of the region (b). In this case, the number E of fail bits is larger than the number E of fail bits in the case of the portion (A) of FIG. 9, which is not preferable. Therefore, the correction amount calculation circuit 17 shifts the read voltage VA to the low voltage side such that the read voltage VA approaches the voltage VAopt. In other words, the correction amount calculation circuit 17 calculates the negative correction amount ΔVA (ΔVA<0).

The portion (C) of FIG. 9 illustrates a case where the read voltage VA is located on the lower voltage side than the threshold voltage VAopt at the position where the two threshold voltage distributions corresponding to the "Er" state and the "A" state intersect. In the case of the portion (C) of FIG. 9, the area of the region (a) is smaller than the area of the region (b). In this case, the number E of fail bits is larger than the number E of fail bits in the case of the portion (A) of FIG. 9, which is not preferable. Therefore, the correction amount calculation circuit 17 shifts the read voltage VA to the high voltage side such that the read voltage VA approaches the voltage VAopt. In other words, the correction amount calculation circuit 17 calculates the positive correction amount ΔVA (ΔVA>0).

Note that it is expected that the absolute value of the difference between the area of the region (a) and the area of the region (b) increases as the read voltage VA moves away from the threshold voltage VAopt. Therefore, the correction amount calculation circuit 17 determines the correction amount ΔVA of the read voltage VA in accordance with the magnitude of the ratio between the area of the region (a) and the area of the region (b). Thus, an appropriate correction amount can be determined in accordance with the degree of overlap between the threshold voltage distributions, and the correction amount ΔVA can be calculated so as to approach the threshold voltage VAopt.

Note that, although not illustrated, the correction amounts ΔVB and ΔVC are calculated for the other read voltages VB and VC in the same manner as for the read voltage VA.

Note that, in the correction amount calculation process based on the data read by using the value (VAini+ΔVApre) obtained by adding the correction amount ΔVApre to the initial value VAini of the read voltage VA, the correction amount ΔVApre is updated to a correction amount ΔVApost as follows. In other words, as in the portion (A) of FIG. 9, if the area of the region (a) is equal to the area of the region (b), the correction amount ΔVA does not need to be updated. Therefore, the correction amount ΔVApost=the correction amount ΔVApre. As in the portion (B) of FIG. 9, if the area of the region (a) is larger than the area of the region (b), the correction amount ΔVApost is updated to a value lower than the correction amount ΔVApre. As in the portion (C) of FIG. 9, if the area of the region (a) is smaller than the area of the region (b), the correction amount ΔVApost is updated to a value higher than the correction amount ΔVApre.

(Second Method)

A second method will now be described.

In the second method, the control circuit 11 executes a plurality of read processes while shifting the read voltage.

After a plurality of read processes, the correction amount calculation circuit 17 calculates the number of memory cell transistors MT (the number of interval cells) for each threshold voltage range segmented by a plurality of read voltages based on a plurality of read data obtained by the plurality of read processes. The correction amount calculation circuit 17 calculates an appropriate read voltage based on the calculated distribution (histogram) of the number of a plurality of interval cells. The correction amount calculation circuit 17 then calculates a difference from an appropriate initial value of the read voltage as a correction amount.

FIG. 10 is a diagram illustrating an example of the second method applied to the correction amount estimation process in the memory system according to the first embodiment.

A portion (A) of FIG. 10 illustrates, as an example, two threshold voltage distributions corresponding to the "Er" state and the "A" state. A portion (B) of FIG. 10 illustrates the transition of the number (the number of on-cells) M of memory cell transistors MT which are turned on. A portion (C) of FIG. 10 illustrates the amount of change in the number of on-cells between two read voltages, that is, the transition of the number C of interval cells. The portion (C) of FIG. 10 corresponds to the above-described histogram.

As illustrated in the portion (B) of FIG. 10, when the read voltage V is shifted to the low voltage side, the number M of on-cells rapidly decreases at a voltage slightly higher than the voltage VErmid which is the mode value of the "Er" state, and |dM/dV| is maximized. Here, the mode value is a voltage at which the distribution probability of the threshold voltage is maximized in the portion (A) of FIG. 10. When the read voltage V is further decreased, the decrease rate of the number M of on-cells decreases, and the decrease rate of the number M of on-cells is minimized at a certain value of the read voltage V. The minimum value of the decrease rate of the number M of on-cells is zero when the threshold voltage distribution belonging to the "A" state and the threshold voltage distribution belonging to the "Er" state do not overlap each other. On the other hand, when the threshold voltage distribution belonging to the "A" state and the threshold voltage distribution belonging to the "Er" state overlap each other, the minimum value of the decrease rate of the number M of on-cells is a value other than zero (>0). When the read voltage V is further decreased, the decrease rate of the number M of on-cells increases again, and |dM/dV| is maximized again at a voltage slightly higher than the voltage VAmid which is the mode value of the "A" state.

With the above-described change in the number M of on-cells, it is possible to detect the read voltage V (that is, the read voltage V corresponding to the intersection of the threshold voltage distributions of the two states) at which the overlap of the threshold voltage distributions between the two states is minimized. For example, a read process is first performed using a read voltage V0. The number of on-cells at this time is defined as M0. The read process is then performed using a voltage V1 which is lower than the voltage V0 by ΔV. The number of on-cells at this time is defined as M1. Then, the number of memory cell transistors MT newly turned off when the read voltage is decreased from V0 to V1 is C1=M0−M1. In other words, the number of interval cells between the threshold voltages [V0, V1] is C1.

Subsequently, the read process is performed using a voltage V2 which is lower than the voltage V1 by ΔV. The number of on-cells at this time is defined as M2. Then, the number of memory cell transistors MT newly turned off when the read voltage is decreased from V1 to V2 is C2=M1−M2. In other words, the number of interval cells between the threshold voltages [V1, V2] is C2. If C1>C2, the voltage at which |dM/dV| is minimized is considered to be located at least on the lower voltage side than the voltage V1.

Subsequently, the read process is performed using a voltage V3 which is lower than the voltage V2 by ΔV. The number of on-cells at this time is defined as M3. Then, the number of memory cell transistors MT newly turned off when the read voltage is decreased from V2 to V3 is C3=M2−M3. In other words, the number of interval cells between the threshold voltages [V2, V3] is C3. If C3>C2, a histogram as illustrated in the portion (C) of FIG. 10 is obtained.

As a result, it is possible to estimate the threshold voltage distribution as indicated by the dashed-and-dotted line in the portion (C) of FIG. 10 by the number C of interval cells. Then, it is possible to estimate that the read voltage at which the overlap between the threshold voltage distribution belonging to the "Er" state and the threshold voltage distribution belonging to the "A" state is minimized exists between the voltage V1 and the voltage V2 (the section in which the number of interval cells is the minimum value).

By operating as described above, in the second method, it is possible to calculate an appropriate read voltage based on a plurality of read processes.

1.2.3 First Condition and Second Condition

Details of the first condition used for the determination process in S12 and the second condition used for the determination process in S15 will now be described.

FIG. 11 is a diagram illustrating an example of a combination of generation conditions of the correction amount application process in the memory system according to the first embodiment. FIG. 11 illustrates possible combinations of specific examples of the first condition used for the determination process in S12 and specific examples of the second condition used for the determination process in S15.

The first condition includes, for example, the following three types of conditions (1) to (3).

(1) A period T1 elapses after data is written to the target block BLK
(2) Periodic internal read process is executed on the standard WL
(3) Data including fail bits greater than or equal to a threshold TH1 is read from the target block BLK Here, the periodic internal read process includes, for example, a patrol process. The patrol process is a process of determining whether or not the data stored in the non-volatile memory 20 is in an error-correctable state. In the patrol process, the read process is executed to cycle through the memory regions in the non-volatile memory 20. The memory controller 10 executes an error correction process on the read data and determines whether or not the number of fail bits included in the read data is less than or equal to an allowable value which is error-correctable. When the number of fail bits exceeds the allowable value, the memory controller 10 executes a refresh process on the storage area from which the data has been read. The refresh process includes a process of rewriting data. As described above, by executing the patrol process, the memory controller 10 can maintain the number of fail bits included in the data in the non-volatile memory 20 to be less than or equal to the allowable value.

The second condition includes, for example, the following three types of conditions (4) to (6).

(4) A period T2 longer than the period T1 elapses after data is written to the target block BLK
(5) Data is read from the target block BLK after the standard correction amount is calculated
(6) Data including fail bits greater than or equal to the threshold TH2 is read from the target block BLK after the standard correction amount is calculated Here, the read process in the condition (5) may or may not be based on a request from the host 2. In other words, the read process in the condition (5) may be an internal read process or a read process based on a request from the host 2.

The first condition and the second condition are applied in the combinations as follows. In other words, if the condition (1) is applied as the first condition, at least one of the condition (4), the condition (5), and the condition (6) is applied as the second condition. If the condition (2) is applied as the first condition, at least one of the condition (5) and the condition (6) is applied as the second condition. If the condition (3) is applied as the first condition, at least one of the condition (5) and the condition (6) is applied as the second condition.

1.2.4 Offset Table Extraction Process

Details of a process of extracting an offset table to be applied (offset table extraction process) in the process in S18 will now be described.

FIG. 12 is a flowchart illustrating an example of the offset table extraction process in the memory system according to the first embodiment.

When the reference correction amount is calculated (start), the control circuit 11 calculates a difference between the standard correction amount calculated in the process in S13 and the reference correction amount calculated in the process in S17 as an ideal offset amount (S21).

The control circuit 11 selects one offset table from a plurality of offset tables stored in the offset information 32 (S22).

The control circuit 11 calculates the sum of squares of the difference for each state between the ideal offset amount calculated in the process in S21 and the offset correction amount corresponding to the ideal offset amount in the offset table selected in the process in S22 (S23).

The control circuit 11 determines whether or not all the offset tables have been selected (S24).

If there is an unselected offset table (S24; no), the control circuit 11 selects one unselected offset table from the plurality of offset tables stored in the offset information 32 (S22). The subsequent processes in S23 and S24 are then executed. As described above, the processes in S22 to S24 are repeated until all the offset tables are selected.

If all the offset tables have been selected (S24; yes), the control circuit 11 extracts an offset table in which the sum of squares calculated in the process in S23 is minimized (S25).

When the process in S25 is ended, the offset table extraction process is ended (end).

1.2.5 Specific Example of Correction Amount to be Applied

A specific example of the correction amount applied by the correction amount application process will now be described.

Figure 14:
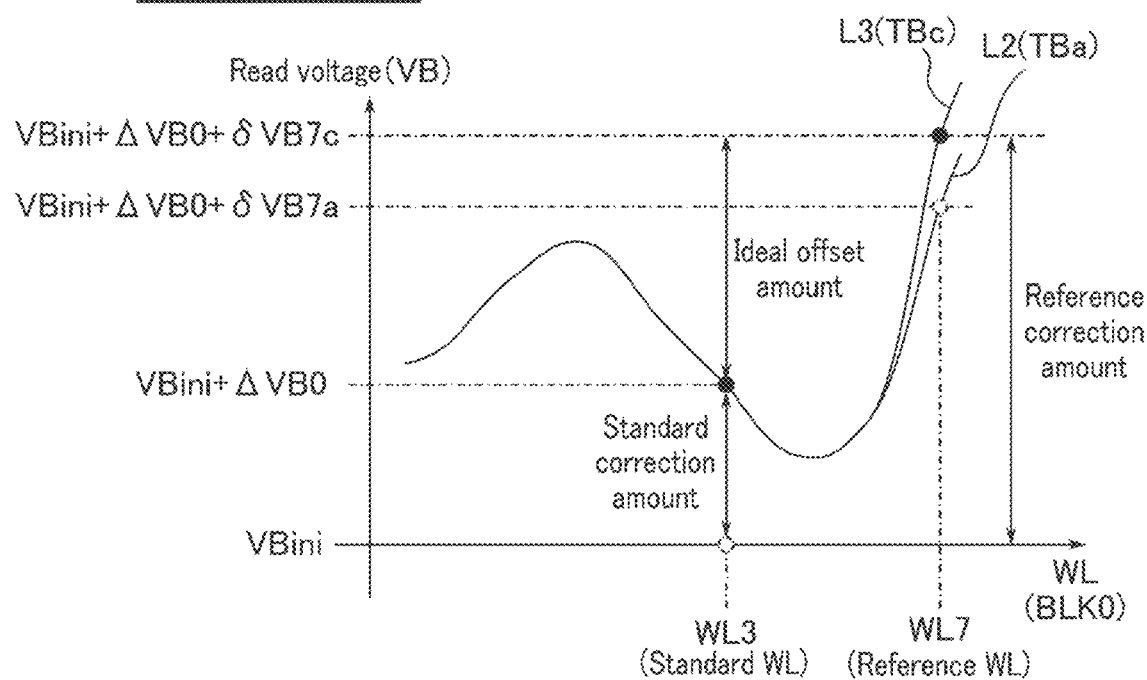
FIG. 14 is a diagram illustrating a second example of the transition of the correction amount applied in the correction amount application process in the memory system according to the first embodiment.

FIG. 13 is a diagram illustrating a first example of the transition of the correction amount applied in the correction amount application process in the memory system according to the first embodiment. FIG. 14 is a diagram illustrating a second example of the transition of the correction amount applied in the correction amount application process in the memory system according to the first embodiment. FIG. 15 is a diagram illustrating a third example of the transition of the correction amount applied in the correction amount application process in the memory system according to the first embodiment. FIG. 16 is a diagram illustrating a fourth example of the transition of the correction amount applied in the correction amount application process in the memory system according to the first embodiment.

The first example illustrates the transition of the correction amount when the standard correction amount is applied to the block BLK0 to which the offset table TBa is applied. The second example illustrates the transition of the correction amount when the offset table applied to the block BLK0 is changed from the offset table TBa to the offset table TBc in accordance with the calculation of the reference correction amount. The third example illustrates the transition of the correction amount when the standard correction amount is applied to the block BLK1 to which the offset table TBa is applied. The fourth example illustrates the transition of the correction amount when the offset table applied to the block BLK1 is changed from the offset table TBa to the offset table TBd in accordance with the calculation of the reference correction amount.

The transition of the correction amount in the block BLK0 will be described with reference to FIGS. 13 and 14. In FIG. 13, the read voltages VB applied before and after the calculation of the standard correction amount are represented by lines L1 and L2, respectively. In FIG. 14, after the standard correction amount is calculated, the read voltages VB applied before and after the calculation of the reference correction amount are represented by lines L2 and L3, respectively.

As illustrated in FIG. 13, before the calculation of the standard correction amount, an initially set offset table TBa is applied to the initial value VBini. Therefore, in the standard WL, the voltage VBini is applied to the read voltage VB. In the reference WL (WL7), a voltage VBini+δVB7a is applied to the read voltage VB.

When the correction amount calculation process for the standard WL is executed, the standard correction amount ΔVB0 calculated by the correction amount calculation process is applied. Thus, in the standard WL, the voltage VBini+ΔVB0 is applied to the read voltage VB. In the reference WL, a voltage VBini+ΔVB0+δVB7a is applied to the read voltage VB.

As illustrated in FIG. 14, when the correction amount calculation process for the reference WL is executed, an ideal offset amount is calculated based on the reference correction amount calculated by the correction amount calculation process and the standard correction amount ΔVB0. Then, the offset table TBc in which the difference in the offset correction amount between the standard WL and the reference WL is close to the ideal offset amount is calculated. Thus, in the reference WL, a voltage VBini+ΔVB0+δVB7c is applied to the read voltage VB. Note that the read voltage VB applied to the standard WL is maintained at the voltage VBini+ΔVB0. As described above, in the block BLK0, the difference in the correction amount between the standard WL and the reference WL changes according to the change of the offset table to be applied.

The transition of the correction amount in the block BLK1 will now be described with reference to FIGS. 15 and 16. In FIG. 15, the read voltages VB applied before and after the calculation of the standard correction amount are represented by lines L1 and L4, respectively. In FIG. 16, after the standard correction amount is calculated, the read voltages VB applied before and after the calculation of the reference correction amount are represented by lines L4 and L5, respectively.

As illustrated in FIG. 15, before the calculation of the standard correction amount, an initially set offset table TBa is applied to the initial value VBini. Therefore, in the standard WL, the voltage VBini is applied to the read voltage VB. In the reference WL, a voltage VBini+δVB7a is applied to the read voltage VB. In other words, in the case of FIG. 15, the read voltage VB equivalent to that of the block BLK0 illustrated in FIG. 13 is applied.

When the correction amount calculation process for the standard WL is executed, the standard correction amount ΔVB1 calculated by the correction amount calculation process is applied. Thus, in the standard WL, the voltage VBini+ΔVB1 is applied to the read voltage VB. In the reference WL, a voltage VBini+ΔVB1+δVB7a is applied to the read voltage VB.

As illustrated in FIG. 16, when the correction amount calculation process for the reference WL is executed, an ideal offset amount is calculated based on the reference correction amount calculated by the correction amount calculation process and the standard correction amount ΔVB1. Then, the offset table TBd in which the difference in the offset correction amount between the standard WL and the reference WL is close to the ideal offset amount is calculated. Thus, in the reference WL, a voltage VBini+ΔVB1+δVB7d is applied to the read voltage VB. Note that the read voltage VB applied to the standard WL is maintained at the voltage VBini+ΔVB1. As described above, in the block BLK1, as in the block BLK0, the difference in the correction amount between the standard WL and the reference WL changes according to the change of the offset table to be applied.

In addition, since the ideal offset amount is different between the block BLK0 and the block BLK1 according to the difference in the characteristics of each block BLK, different offset tables are applied. Accordingly, after the calculation of the reference correction amount, the difference in the correction amount between the standard WL and the reference WL is different between the block BLK0 and the block BLK1.

1.3 Effect According to First Embodiment

According to the first embodiment, when the first condition is satisfied, the memory controller 10 executes the correction amount calculation process on the standard WL and applies the obtained standard correction amount to all the read voltages applied to the target block BLK. Thus, the memory controller 10 maintains the difference between the read voltage applied to the standard WL and the read voltage applied to the reference WL, and changes both the read voltage applied to the standard WL and the read voltage applied to the reference WL. Therefore, the change in the read voltage in the standard WL can be reflected in the entire target block BLK.

In addition, when the second condition is satisfied after the first condition has been satisfied, the memory controller 10 executes the correction amount calculation process on the reference WL, and applies an offset table that matches both the obtained reference correction amount and the standard correction amount to the target block BLK. Thus, the memory controller 10 changes the difference between the read voltage applied to the standard WL and the read voltage applied to the reference WL, and changes at least one of the read voltage applied to the standard WL and the read voltage applied to the reference WL. Therefore, it is possible to more finely adjust the read voltage in consideration of the change in the read voltage for each word line WL. Accordingly, it is possible to apply an appropriate read voltage for reading data having a small number of fail bits.

In addition, the offset table applied to a certain target block BLK is changed independently of the offset table applied to the other blocks BLK. Thus, it is possible to change an appropriate offset table for each block BLK at an appropriate timing. Therefore, it is possible to apply an appropriate read voltage for reading data having a small number of fail bits.

1.4 Modification of First Embodiment

Various modifications can be applied to the first embodiment described above. For example, in the above-described first embodiment, the case where the sum of squares of the difference for each state between the ideal offset amount and the corresponding offset correction amount is calculated for all the offset tables has been described, but the embodiment is not limited thereto. The sum of squares may be selectively calculated for an offset table that satisfies a predetermined condition.

In the following description, configurations and operations different from those of the first embodiment will be mainly described. Description of configurations and operations equivalent to those of the first embodiment will be omitted as appropriate.

FIG. 17 is a flowchart illustrating an example of the offset table extraction process in the memory system according to a modification of the first embodiment. FIG. 17 corresponds to FIG. 12 in the first embodiment.

When the reference correction amount is calculated (start), the control circuit 11 calculates a difference between the standard correction amount calculated in the process in S13 and the reference correction amount calculated in the process in S17 as an ideal offset amount (S31).

The control circuit 11 selects one offset table from a plurality of offset tables stored in the offset information 32 (S32).

The control circuit 11 calculates, for each state, the difference between the ideal offset amount calculated in the process in S31 and the offset correction amount corresponding to the ideal offset amount in the offset table selected in the process in S32 (S33).

The control circuit 11 determines whether or not there is a state in which the difference for each state calculated in the process in S33 is greater than or equal to a threshold TH3 (S34).

If there is no state in which the difference is greater than or equal to the threshold TH3 (S34; no), the control circuit 11 calculates the sum of squares of the difference for each state calculated in the process in S33 (S35).

After the process in S35 or if there is a state in which the difference is greater than or equal to the threshold TH3 (S34; yes), the control circuit 11 determines whether or not all the offset tables have been selected (S36).

If there is an unselected offset table (S36; no), the control circuit 11 selects one unselected offset table from the plurality of offset tables stored in the offset information 32 (S32). The subsequent processes in S33 to S36 are then executed. As described above, the processes in S32 to S36 are repeated until all the offset tables are selected.

If all the offset tables have been selected (S36; yes), the control circuit 11 extracts an offset table in which the sum of squares calculated in the process in S35 is minimized (S37).

When the process in S37 is ended, the offset table extraction process is ended (end).

According to the modification of the first embodiment, it is possible to avoid extraction of an offset table having a state in which the sum of squares of the difference for each state is the minimum but the offset correction amount is significantly different from the ideal offset amount. Thus, it is possible to apply an offset table corresponding to the characteristics of the block BLK. Therefore, it is possible to suppress an increase in the number of fail bits included in the read data based on the read voltage to be applied.

2. Second Embodiment

A memory system according to a second embodiment will now be described. The second embodiment is different from the first embodiment in that an offset table is newly generated. In the following description, configurations and operations different from those of the first embodiment will be mainly described. Description of configurations and operations equivalent to those in the first embodiment will be omitted as appropriate.

2.1 Offset Table Extraction Process

FIG. 18 is a flowchart illustrating an example of an offset table extraction process in the memory system according to the second embodiment. FIG. 18 corresponds to FIG. 12 in the first embodiment.

When the reference correction amount is calculated (start), the control circuit 11 calculates a difference between the standard correction amount calculated in the process in S13 and the reference correction amount calculated in the process in S17 as an ideal offset amount (S41).

The control circuit 11 selects one offset table from a plurality of offset tables stored in the offset information 32 (S42).

The control circuit 11 calculates the sum of squares of the difference for each state between the ideal offset amount calculated in the process in S41 and the offset correction amount corresponding to the ideal offset amount in the offset table selected in the process in S42 (S43).

The control circuit 11 determines whether or not all the offset tables have been selected (S44).

If there is an unselected offset table (S44; no), the control circuit 11 selects one unselected offset table from the plurality of offset tables stored in the offset information 32 (S42). The subsequent processes in S43 and S44 are then executed. As described above, the processes in S42 to S44 are repeated until all the offset tables are selected.

If all the offset tables have been selected (S44; yes), the control circuit 11 determines whether or not the minimum sum of squares among the sum of squares calculated in the process in S43 is less than or equal to the threshold TH4 (S45).

If the minimum sum of squares exceeds the threshold TH4 (S45; no), the control circuit 11 generates a new offset table such that the sum of squares is less than or equal to the threshold TH4 (S46). For example, by generating an offset table such that the correction offset amount in the standard WL is equal to the standard correction amount and the correction offset amount in the reference WL is equal to the reference correction amount, the sum of squares can be less than or equal to the threshold TH4.

If the minimum sum of squares is less than or equal to the threshold TH4 (S45; yes), or after the process in S46, the control circuit 11 extracts an offset table in which the sum of squares is minimized (S47).

When the process in S47 is ended, the offset table extraction process is ended (end).

2.2 Effect According to Second Embodiment

According to the second embodiment, in the offset table extraction process, the memory controller 10 generates a new offset table, if the minimum value of the sum of squares of the difference between the ideal offset amount and the corresponding offset correction amount in the offset table exceeds the threshold TH4. Thus, an offset table having an offset correction amount close to the ideal offset amount can be applied to the target block BLK. Therefore, it is possible to suppress an increase in the number of fail bits included in the read data based on the read voltage to be applied.

2.3 Modification of Second Embodiment

Various modifications can be applied to the second embodiment described above. For example, in the above-described second embodiment, the case where the number of offset tables stored in the offset information 32 increases every time an offset table is newly generated has been described, but the embodiment is not limited thereto. The offset tables may be merged such that the number of offset tables stored in the offset information 32 does not exceed a predetermined number.

In the following description, configurations and operations different from those of the second embodiment will be mainly described. Description of configurations and operations equivalent to those of the second embodiment will be omitted as appropriate.

FIG. 19 is a flowchart illustrating an example of an offset table merge process in a memory system according to a modification of the second embodiment. It is assumed that the processes in S51 to S57 illustrated in FIG. 19 are executed, for example, after the process in S46 in FIG. 18.

When a new offset table TBx is generated (start), the control circuit 11 extracts a set including offset tables (TBp, TBq) in which the sum of squares of the differences between the corresponding offset correction amounts is minimized from all the offset tables except the generated offset table TBx (S51).

The control circuit 11 further extracts an offset table TBy in which the sum of squares of the differences between the corresponding offset correction amounts is minimized with the offset table TBx (S52).

The control circuit 11 determines whether or not the sum of squares between the set (TBp, TBq) extracted in the process in S51 is smaller than the sum of squares between the set (TBx, TBy) extracted in the process in S52 (S53).

If the sum of squares between the set (TBp, TBq) is smaller than the sum of squares between the set (TBx, TBy) (S53; yes), the control circuit 11 merges the offset tables TBp and TBq to generate a new offset table TBr (S54). The offset table TBr includes, for example, an internally dividing point (e.g., a middle point) between the offset correction amount of the offset table TBp and the corresponding offset correction amount of the offset table TBq, as the offset correction amount.

The control circuit 11 deletes the offset tables TBp and TBq from the offset information 32, and registers the offset table TBr generated in the process in S54 in the offset information 32 (S55).

If the sum of squares between the set (TBx, TBy) is smaller than the sum of squares between the set (TBp, TBq) (S53; no), the control circuit 11 merges the offset tables TBx and TBy to generate a new offset table TBz (S56). The offset table TBz includes, for example, an internally dividing point (e.g., a middle point) between the offset correction amount of the offset table TBx and the corresponding offset correction amount of the offset table TBy, as the offset correction amount.

The control circuit 11 deletes the offset tables TBx and TBy from the offset information 32, and registers the offset table TBz generated in the process in S56 in the offset information 32 (S57).

After the process in S55 or after the process in S57, the offset table merge process is ended (end).

According to the modification of the second embodiment, similar offset tables are merged into one table. Thus, it is possible to suppress a one-sided increase in the data size of the offset information 32 by the generation of a new offset table. Note that, since the offset tables to be merged have offset correction amounts similar to each other, the effect of reducing the number of fail bits by selectively using these offset tables is relatively small. Therefore, the deterioration of the estimation accuracy of the read voltage due to the merging of the offset tables can be minimized.

3. Others

In the first embodiment, the second embodiment, and the modifications of the first embodiment and the second embodiment described above, the case where 2-bit data can be stored in one memory cell transistor MT has been described, but the embodiments are not limited thereto, and the embodiments can be similarly applied to a case where 3-bit or more data can be stored.

In the above-described modification of the second embodiment, the case where offset tables similar to each other are merged has been described, but a method of suppressing an increase in the number of offset tables is not limited thereto. For example, the control circuit 11 may preferentially delete an offset table that is not currently applied to the block BLK. Thus, it is possible to suppress an increase in the number of offset tables in the offset information 32 while generating an offset table according to the characteristics of the current block BLK.

While certain embodiments have been described, these embodiments have been presented by way of example only, and are not intended to limit the scope of the invention. Indeed, the embodiments described herein may be embodied in a variety of other forms; furthermore, various omissions, substitutions and changes in the form of the embodiments described herein may be made without departing from the spirit of the inventions. The embodiments and modifications are included in the scope and spirit of the invention and are included in the scope of the claimed inventions and their equivalents.

What is claimed is:

1. A memory system comprising:
a non-volatile memory including a plurality of blocks each including a plurality of memory cells; and
a memory controller configured to execute a first read process of reading data from a first memory cell in a first block by using a first read voltage and a second read process of reading data from a second memory cell in the first block by using a second read voltage, wherein the memory controller is configured to:
maintain, in a case where a first condition is satisfied, a difference between the first read voltage and the second read voltage at a first value, and change both the first read voltage and the second read voltage; and
change, in a case where a second condition is satisfied after the first condition has been satisfied, a difference between the first read voltage and the second read voltage from the first value to a second value different from the first value, and change at least one of the first read voltage and the second read voltage,
the first condition is a first sub-condition, a second sub-condition, or a third sub-condition,
in a case where the first condition is the first sub-condition, the second condition is a fourth sub-condition, a fifth sub-condition, or a sixth sub-condition,
in a case where the first condition is the second sub-condition or the third sub-condition, the second condition is the fifth sub-condition or the sixth sub-condition, the first sub-condition is that a first period elapses after data is written to the first memory cell and the second memory cell, the second sub-condition is that the memory controller executes the first read process independently of an instruction from an external host, the third sub-condition is that data including fail bits greater than or equal to a second threshold is read from the first block, the fourth sub-condition is that a second period longer than the first period elapses after data is written to the first memory cell and the second memory cell, the fifth sub-condition is that data is read from the first block after the difference is maintained at the first value and both the first read voltage and the second read voltage are changed, and the sixth sub-condition is that data including fail bits greater than or equal to a first threshold is read from the first block after the difference is maintained at the first value and both the first read voltage and the second read voltage are changed.

2. The memory system according to claim 1, wherein:

the non-volatile memory includes a second block including a third memory cell and a fourth memory cell; and the memory controller is configured to:

execute a third read process of reading data from the third memory cell by using a third read voltage, and a fourth read process of reading data from the fourth memory cell by using a fourth read voltage, and change a difference between the third read voltage and the fourth read voltage from a third value to a fourth value different from the third value, and change at least one of the third read voltage and the fourth read voltage, and a difference between the first value and the second value is different from a difference between the third value and the fourth value.

3. The memory system according to claim 2, wherein the memory controller is configured to independently execute changing at least one of the first read voltage and the second read voltage and changing at least one of the third read voltage and the fourth read voltage.

4. The memory system according to claim 2, wherein the memory controller is configured to independently execute changing both the first read voltage and the second read voltage and changing both the third read voltage and the fourth read voltage.

5. The memory system according to claim 2, wherein the non-volatile memory further includes a first word line coupled to the first memory cell, a second word line coupled to the second memory cell, a third word line coupled to the third memory cell, and a fourth word line coupled to the fourth memory cell, the second word line is different from the first word line, and the fourth word line is different from the third word line.

6. The memory system according to claim 2, wherein each of the first memory cell, the second memory cell, the third memory cell, and the fourth memory cell is configured to store data including a first bit and a second bit different from the first bit, the first read process is a process of reading data of the first bit from the first memory cell by using the first read voltage, the second read process is a process of reading data of the first bit from the second memory cell by using the second read voltage, the third read process is a process of reading data of the first bit from the third memory cell by using the third read voltage, and the fourth read process is a process of reading data of the first bit from the fourth memory cell by using the fourth read voltage.

7. The memory system according to claim 1, wherein the non-volatile memory further includes a first word line coupled to the first memory cell and a second word line coupled to the second memory cell, and the second word line is different from the first word line.

8. The memory system according to claim 1, wherein the memory controller is configured to:

manage a plurality of tables each storing information indicating the difference between the first read voltage and the second read voltage; and maintain the difference between the first read voltage and the second read voltage at the first value by using a first table of the plurality of tables.

9. The memory system according to claim 8, wherein the memory controller is configured to change the difference between the first read voltage and the second read voltage to the second value by using a second table of the plurality of tables, and the second table is different from the first table.

10. The memory system according to claim 9, wherein the memory controller is configured to:

manage an initial voltage and a reference correction amount;

determine the first read voltage based on the initial voltage and the reference correction amount; and change, in the case where the first condition is satisfied, the first read voltage by changing the reference correction amount.

11. The memory system according to claim 1, wherein the memory controller is configured to:

manage an initial voltage and a reference correction amount;

determine the first read voltage based on the initial voltage and the reference correction amount;

manage a plurality of tables each storing information indicating the difference between the first read voltage and the second read voltage; and determine the second read voltage by using one of the plurality of tables.

12. The memory system according to claim 11, wherein the memory controller is configured to:

determine, before the first condition is satisfied, the second read voltage by using a first table of the plurality of tables; and in the case where the first condition is satisfied:

change the first read voltage by changing the reference correction amount; and maintain the difference between the first read voltage and the second read voltage at the first value by using the first table.

13. The memory system according to claim 12, wherein the memory controller is configured to change, in the case where the second condition is satisfied, the difference between the first read voltage and the second read voltage to the second value by using a second table of the plurality of tables, and the second table is different from the first table.

14. The memory system according to claim 1, wherein each of the first memory cell and the second memory cell is configured to store data including a first bit and a second bit different from the first bit, the first read process is a process of reading data of the first bit from the first memory cell by using the first read voltage, and the second read process is a process of reading data of the first bit from the second memory cell by using the second read voltage.

15. The memory system according to claim 14, wherein the memory controller is configured to execute a fifth read process of reading data of the second bit from the first memory cell by using a fifth read voltage and a sixth read process of reading data of the second bit from the second memory cell by using a sixth read voltage.

16. The memory system according to claim 15, wherein the fifth read voltage is different from the first read voltage, and the sixth read voltage is different from the second read voltage.

\* \* \* \* \*